US010908500B2

(12) United States Patent
Shoji et al.

(10) Patent No.: US 10,908,500 B2
(45) Date of Patent: Feb. 2, 2021

(54) CURED FILM AND METHOD FOR PRODUCING SAME

(71) Applicant: TORAY INDUSTRIES, INC., Tokyo (JP)

(72) Inventors: Yu Shoji, Otsu (JP); Yuki Masuda, Otsu (JP); Kimio Isobe, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 401 days.

(21) Appl. No.: 16/063,893

(22) PCT Filed: Jan. 10, 2017

(86) PCT No.: PCT/JP2017/000442
§ 371 (c)(1),
(2) Date: Jun. 19, 2018

(87) PCT Pub. No.: WO2017/122623
PCT Pub. Date: Jul. 20, 2017

(65) Prior Publication Data
US 2019/0004423 A1    Jan. 3, 2019

(30) Foreign Application Priority Data

Jan. 15, 2016 (JP) .................... 2016-006127
Aug. 30, 2016 (JP) .................... 2016-167684

(51) Int. Cl.
| | | |
|---|---|---|
| *G03F 7/023* | (2006.01) | |
| *C08G 73/22* | (2006.01) | |
| *G03F 7/40* | (2006.01) | |
| *G03F 7/085* | (2006.01) | |
| *G03F 7/075* | (2006.01) | |
| *G03F 7/022* | (2006.01) | |

(52) U.S. Cl.
CPC ............ *G03F 7/0233* (2013.01); *C08G 73/22* (2013.01); *G03F 7/0226* (2013.01); *G03F 7/0751* (2013.01); *G03F 7/085* (2013.01); *G03F 7/40* (2013.01)

(58) Field of Classification Search
CPC ........ C08G 73/22; G03F 7/085; G03F 7/0751

USPC ............................................ 430/270.1, 277.1
See application file for complete search history.

(56) References Cited

U.S. PATENT DOCUMENTS

| | | | |
|---|---|---|---|
| 10,584,205 B2 * | 3/2020 | Shoji ................... | C08L 79/02 |
| 2002/0162998 A1 * | 11/2002 | Okuda ................. | G03F 7/0392 257/59 |
| 2007/0122733 A1 * | 5/2007 | Hattori ............. | H01L 21/31144 430/141 |
| 2010/0062273 A1 * | 3/2010 | Makabe ................. | C08L 79/04 428/473.5 |
| 2010/0092879 A1 | 4/2010 | Minegishi et al. | |
| 2012/0100484 A1 | 4/2012 | Hirano et al. | |
| 2016/0178893 A1 * | 6/2016 | Kinoshita ............... | G03F 7/038 359/290 |
| 2018/0203353 A1 * | 7/2018 | Shoji ...................... | G03F 7/023 |

FOREIGN PATENT DOCUMENTS

| | | |
|---|---|---|
| JP | 2011-84562 A | 4/2011 |
| JP | 2012-133091 A | 7/2012 |
| WO | WO 2008/111470 A1 | 9/2008 |
| WO | WO 2010/134207 A1 | 11/2010 |

OTHER PUBLICATIONS

English translation of JP 2012-133091 a published in Jul. 2012 obtained from IP.com, 32 pages. (Year: 2012).*
English translation of JP 2011-84562 a published 2011 obtained from IP.com , 27 pages. (Year: 2011).*
International Search Report, issued in PCT/JP2017/000442, PCT/ISA/210, dated Mar. 21, 2017.
Written Opinion of the International Searching Authority, issued in PCT/JP2017/000442, PCT/ISA/237, dated Mar. 21, 2017.

* cited by examiner

*Primary Examiner* — Cynthia Hamilton
(74) *Attorney, Agent, or Firm* — Birch, Stewart, Kolasch & Birch, LLP

(57) ABSTRACT

Provided is a cured film having high chemical resistance, high elongation, and high adhesion to metal copper. A cured film formed by curing a photosensitive resin composition containing a polybenzoxazole precursor, in which a rate at which the polybenzoxazole precursor is cyclized into polybenzoxazole is not less than 10% and not more than 60%.

17 Claims, 2 Drawing Sheets

CURED FILM AND METHOD FOR PRODUCING SAME

TECHNICAL FIELD

The present invention relates to a cured film made from a photosensitive resin composition and a method of manufacturing the same. More particularly, the present invention relates to a photosensitive resin composition and a cured film made therefrom suitably used for a surface protection film and an interlayer insulating film in a semiconductor device and the like, and for an insulating layer in an organic electroluminescent device, and the like, as well as to a method of manufacturing the same.

BACKGROUND ART

Conventionally, polyimide resins and polybenzoxazole resins, which are excellent in heat resistance, electric insulation, and the like, have widely been used for a surface protection film or interlayer insulating film in a semiconductor device, an insulating layer in an organic electrolytic device, and/or a flattening film in a TFT substrate. Furthermore, photosensitive polyimides and photosensitive polybenzoxazoles to which photosensitive properties have been provided have been studied to enhance the overall productivity. However, those resins in the film form are well dissolved during development or much influenced by an environment in which they are used, and thus it has been indicated that they are difficult to use in industry.

On the one hand, a positive photosensitive resin composition containing a hydroxystyrene resin, a polyamic acid, and a quinonediazide compound has been proposed (Patent Literature 1). In this resin composition, the solubility in an alkaline solution, which is a developer solution, is reduced in an unexposed portion based on the interaction between the phenolic hydroxyl group of the hydroxystyrene resin and the quinonediazide compound. In contrast, the solubility in the alkaline solution is significantly increased in an exposed portion through the light-induced acid generation by the quinonediazide compound. This difference in the solubility in the alkaline solution between the unexposed portion and the exposed portion allows the production of a positive relief pattern.

Furthermore, a positive photosensitive resin composition containing a compound having a polyhydroxystyrene resin and alkoxymethyl group or methylol group has been proposed, which achieves an increased sensitivity and a lowered stress (Patent Literature 2).

Moreover, polybenzoxazoles containing a flexible group synthesized from an aliphatic dicarboxylic acid (Patent Literature 3) have been proposed as photosensitive resin compositions having flexibility.

CITATION LIST

Patent Literature

Patent Literature 1: JP 2007-156243 A
Patent Literature 2: JP 4692219 B2
Patent Literature 3: JP 2008-224984 A

SUMMARY OF INVENTION

Technical Problem

In recent years, the increasing degree of integration of semiconductor devices has been accompanied by the attraction of attention to semiconductor devices formed using multiple metal re-wiring layers. Production processes of semiconductor devices include a step of detaching a resist, and an insulating film between metal re-wiring layers is required to have resistance, as chemical resistance, to resist removing liquids. However, the above-mentioned materials do not have sufficient resistance to resist removing liquids, and, in some cases, cause swelling, elution, peeling, or the like.

In order to enhance the chemical resistance, the introduction of a large amount of crosslinker can be considered, but, in some cases, the mechanical properties of the obtained cured film are remarkably degraded as a result of the formation of a three-dimensional network structure by the large amount of crosslinker.

In addition, there is a problem in that the polybenzoxazoles containing a flexible group that are synthesized from aliphatic dicarboxylic acids undergo dehydrating cyclization when cured, and thus cause an increased stress on a substrate wafer and a decreased interaction due to a decrease in functional groups, thereby reducing the adhesion to metals (such as copper), particularly reducing the adhesion to metals after a reliability test such as a heat shock test.

The present invention will solve problems associated with conventional techniques as described above and provide cured films of high chemical resistance, high elongation, and high adhesion to metals, particularly to copper.

Solution to Problem

In order to achieve the above object, the present invention relates to the following.

That is, the present invention relates to a cured film formed by curing a photosensitive resin composition containing a polybenzoxazole precursor, in which a rate at which the polybenzoxazole precursor is cyclized into polybenzoxazole is not less than 10% and not more than 60%.

Also, the present invention relates to a method of manufacturing the cured film, the method comprising the steps of: applying the photosensitive resin composition onto a substrate and drying it to form a photosensitive resin film, or forming a photosensitive sheet from the photosensitive resin composition and laminating it onto a substrate to form a photosensitive resin film; exposing the resulting film to light through a mask; dissolving or removing the exposed portion with an alkaline solution; and heat-treating the developed photosensitive resin film.

Also, the present invention relates to an interlayer insulating film or semiconductor protective film, semiconductor electronic component, and semiconductor device, to which the cured film has been arranged.

Advantageous Effects of Invention

According to the present invention, a cured film of high chemical resistance, high elongation, and high adhesion to metals, particularly to copper, can be obtained. Moreover, electronic components or semiconductor devices according to the present invention have a pattern having a good shape, preferable adhesion properties, and excellent chemical resistance, which make them highly reliable.

DESCRIPTION OF EMBODIMENTS

Figure 1:
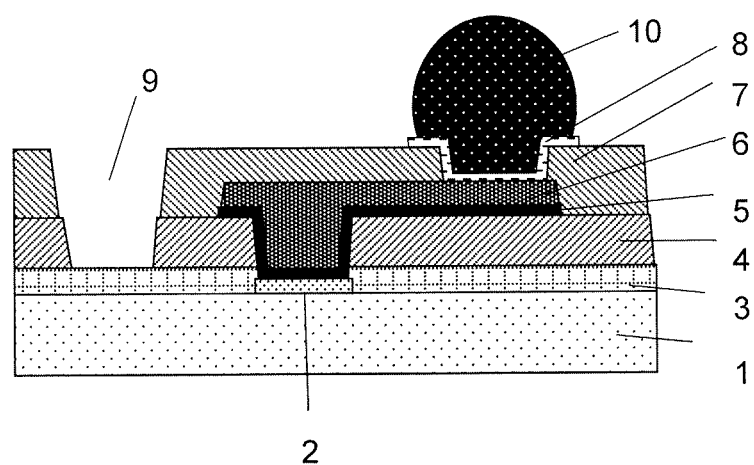
FIG. 1 depicts an enlarged cross-sectional view of a pad portion of a semiconductor device having a bump.

The cured film according to the present invention is a cured film formed by curing a photosensitive resin composition, in which the photosensitive resin composition contains a polybenzoxazole precursor, and in which a rate at which the polybenzoxazole precursor in the cured film is cyclized into polybenzoxazole is not less than 10% and not more than 60%. That is, it is a resin in which a part of particular poly(o-hydroxyamide) structural units in the cured film have been converted to oxazole. A cured film refers to a film resulting from a photosensitive resin composition that is applied, exposed to light, developed, and then subjected to a temperature of 150° C. to 320° C. so as to undergo the progress of heat-crosslinking reaction.

In the cured film according to the present invention, a rate at which the polybenzoxazole precursor is cyclized into polybenzoxazole is not less than 10% and not more than 60%, thereby enhancing the resistance of the cured film to resist removing liquids, and the cyclization is not made complete, thereby ensuring high adhesion to metals. Here, the ring closure rate refers to a rate at which polybenzoxazole precursor structural units are cyclized into polybenzoxazole, and the rate is calculated through FT-IR measurement. Applying a ring closure rate of not less than 10%, more preferably not less than 15%, in the cured film makes it possible to reduce polar groups derived from polybenzoxazole precursors, lower affinity to resist removing liquids, and achieve chemical resistance. In addition, applying a ring closure rate of not more than 60%, more preferably not more than 55%, in the cured film allows polar groups derived from polybenzoxazole precursors to remain and thus makes it possible to enhance adhesion to other materials such as molding resins and metals. Further, the introduction of a flexible structure into a polybenzoxazole precursor increases the entanglement of molecular chains and thus can afford a cured film having high mechanical properties, particularly high elongation.

In other words, the cured film according to the present invention is such that a rate at which the polybenzoxazole precursor is cyclized into polybenzoxazole is not less than 10% and not more than 60%, thereby achieving both chemical resistance and adhesion to metals, and such that the polybenzoxazole precursor has a flexible structure, thereby having high elongation.

Examples of polybenzoxazole precursors include, but are not limited to, poly(o-hydroxyamide), polymers in which part of hydroxyl groups of poly(o-hydroxyamide) are protected with an organic group, and the like.

The polybenzoxazole precursor according to the present invention is a polyamide having a structural unit (A) represented by the general formula (1) and is obtainable through the polycondensation of a dicarboxylic acid having a structure of $X^1(COOH)_2$ or a dicarboxylic acid derivative having a structure of $X^1(COZ)_2$ with a diamine having a structure of $Y^1(NH_2)_2$:

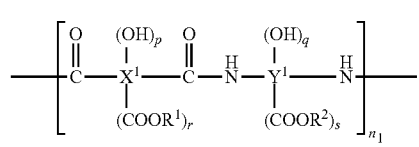
(1)

(wherein $X^1$ and $Y^1$ each independently represent an organic group having two to eight valences and containing two or more carbon atoms; $R^1$ and $R^2$ each independently represent a hydrogen atom or a $C_1$-$C_{20}$ organic group; n1 is an integer number in the range from 2 to 500; p and q are each independently an integer number from 0 to 4; and r and s each independently represent an integer number from 0 to 2; provided that, when p, q, r, or s is 0, the functional group in the parentheses is a hydrogen atom.)

In the context of the solubility in an alkaline solution, the polybenzoxazole precursor according to the present invention preferably contains not less than 50%, more preferably not less than 70%, of the repeating unit in which p or q is not less than 1 and not more than 4, relative to the total structural units.

Examples of dicarboxylic acids having a structure of $X^1(COOH)_2$ and dicarboxylic acid derivatives having a structure of $X^1(COZ)_2$ include, but are not limited to: aliphatic dicarboxylic acids such as cyclobutanedicarboxylic acid, cyclohexane dicarboxylic acid, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, and diglycolic acid; in addition, tricarboxylic acids such as trimellitic acid and trimesic acid; these acids provided that part of hydrogen atoms of the aromatic ring or hydrocarbon thereof is/are substituted with a $C_1$-$C_{10}$ alkyl group or fluoroalkyl group; and these acids provided that $X^1$ is an aromatic group selected from the following structural formulae.

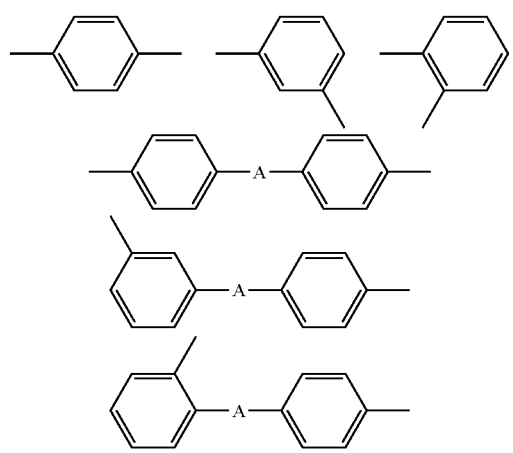

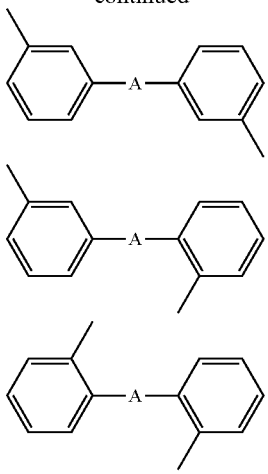

(wherein A has a divalent group selected from the group consisting of—, —O—, —S—, —SO$_2$—, —COO—, —OCO—, —CONH—, —NHCO—, —C(CH$_3$)$_2$—, —C(CF$_3$)$_2$—).

For the dicarboxylic acid derivative having a structure of X$^1$(COZ)$_2$, Z is a group selected from C$_1$-C$_{12}$ organic groups or halogen elements, and is preferably selected from the structural formulae below:

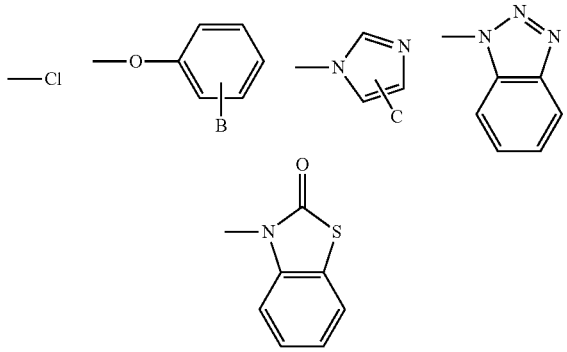

(wherein B and C are, but not limited to, a hydrogen atom, methyl group, ethyl group, propyl group, isopropyl group, t-butyl group, trifluoromethyl group, halogen group, phenoxy group, nitro group, or the like).

Examples of diamines having a structure of Y$^1$(NH$_2$)$_2$ include, but are not limited to: aromatic diamines such as m-phenylenediamine, p-phenylenediamine, 3,5-diaminobenzoic acid, 1,5-naphthalenediamine, 2,6-naphthalenediamine, 9,10-anthracenediamine, 2,7-diaminofluorene, 4,4'-diaminobenzanilide, 3,4'-diaminodiphenylether, 4,4'-diaminodiphenylether, 3-carboxy-4,4'-diaminodiphenylether, 3-sulfonic acid-4,4'-diaminodiphenylether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 4-aminobenzoic acid 4-aminophenyl ester, 9,9-bis(4-aminophenyl)fluorene, 1,3-bis(4-anilino)tetramethyldisiloxane, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, bis(4-aminophenoxyphenyl)sulfone, bis(3-aminophenoxyphenyl)sulfone, bis(4-aminophenoxy)biphenyl, bis[4-(4-aminophenoxy)phenyl]ether, 2,2-bis[4-(4-aminophenoxy)phenyl]propane, 2,2-bis[4-(4-aminophenoxy)phenyl]hexafluoropropane, 1,4-bis(4-aminophenoxy)benzene, 1,3-bis(3-aminophenoxy)benzene, 1,3-bis(4-aminophenoxy)benzene, bis(3-amino-4-hydroxyphenyl)sulfone, bis(3-amino-4-hydroxyphenyl)propane, bis(3-amino-4-hydroxyphenyl)hexafluoropropane, bis(3-amino-4-hydroxyphenyl)methylene, bis(3-amino-4-hydroxyphenyl) ether, bis(3-amino-4-hydroxy)biphenyl, 4,4'-diamino-6,6'-bis(trifluoromethyl)-[1,1'-biphenyl]-3,3'-diol, 9,9-bis(3-amino-4-hydroxyphenyl)fluorene, 2,2'-bis[N-(3-aminobenzoyl)-3-amino-4-hydroxyphenyl]propane, 2,2'-bis[N-(3-aminobenzoyl)-3-amino-4-hydroxyphenyl]hexafluoropropane, 2,2'-bis[N-(4-aminobenzoyl)-3-amino-4-hydroxyphenyl]propane, 2,2'-bis[N-(4-aminobenzoyl)-3-amino-4-hydroxyphenyl]hexafluoropropane, bis[N-(3-aminobenzoyl)-3-amino-4-hydroxyphenyl]sulfone, bis[N-(4-aminobenzoyl)-3-amino-4-hydroxyphenyl]sulfone, 9,9-bis[N-(3-aminobenzoyl)-3-amino-4-hydroxyphenyl]fluorene, 9,9-bis[N-(4-aminobenzoyl)-3-amino-4-hydroxyphenyl]fluorene, N,N'-bis(3-aminobenzoyl)-2,5-diamino-1,4-dihydroxybenzene, N,N'-bis(4-aminobenzoyl)-2,5-diamino-1,4-dihydroxybenzene, N,N'-bis(4-aminobenzoyl)-4,4'-diamino-3,3-dihydroxybiphenyl, N,N'-bis(3-aminobenzoyl)-3,3'-diamino-4,4-dihydroxybiphenyl, N,N'-bis(4-aminobenzoyl)-3,3'-diamino-4,4-dihydroxybiphenyl, 2-(4-aminophenyl)-5-aminobenzoxazole, 2-(3-aminophenyl)-5-aminobenzoxazole, 2-(4-aminophenyl)-6-aminobenzoxazole, 2-(3-aminophenyl)-6-aminobenzoxazole, 1,4-bis(5-amino-2-benzoxazolyl)benzene, 1,4-bis(6-amino-2-benzoxazolyl)benzene, 1,3-bis(5-amino-2-benzoxazolyl)benzene, 1,3-bis(6-amino-2-benzoxazolyl)benzene, 2,6-bis(4-aminophenyl)benzobisoxazole, 2,6-bis(3-aminophenyl)benzobisoxazole, bis[(3-aminophenyl)-5-benzoxazolyl], bis[(4-aminophenyl)-5-benzoxazolyl], bis[(3-aminophenyl)-6-benzoxazolyl], and bis[(4-aminophenyl)-6-benzoxazolyl]; these compounds provided that part of hydrogen atoms of the aromatic ring thereof is/are substituted with a C$_1$-C$_{10}$ alkyl group or fluoroalkyl group, a halogen atom, or the like; compounds having the below-mentioned structure; and the like. Other diamines to be used for copolymerization can be used directly or as corresponding diisocyanate compounds or trimethylsilylated diamines. Moreover, these two or more diamine components may be used in combination.

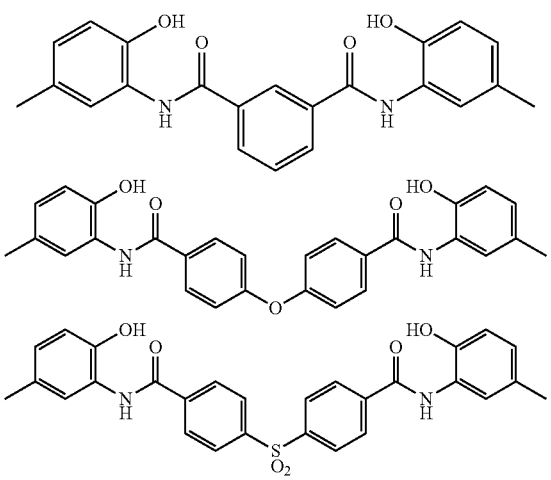

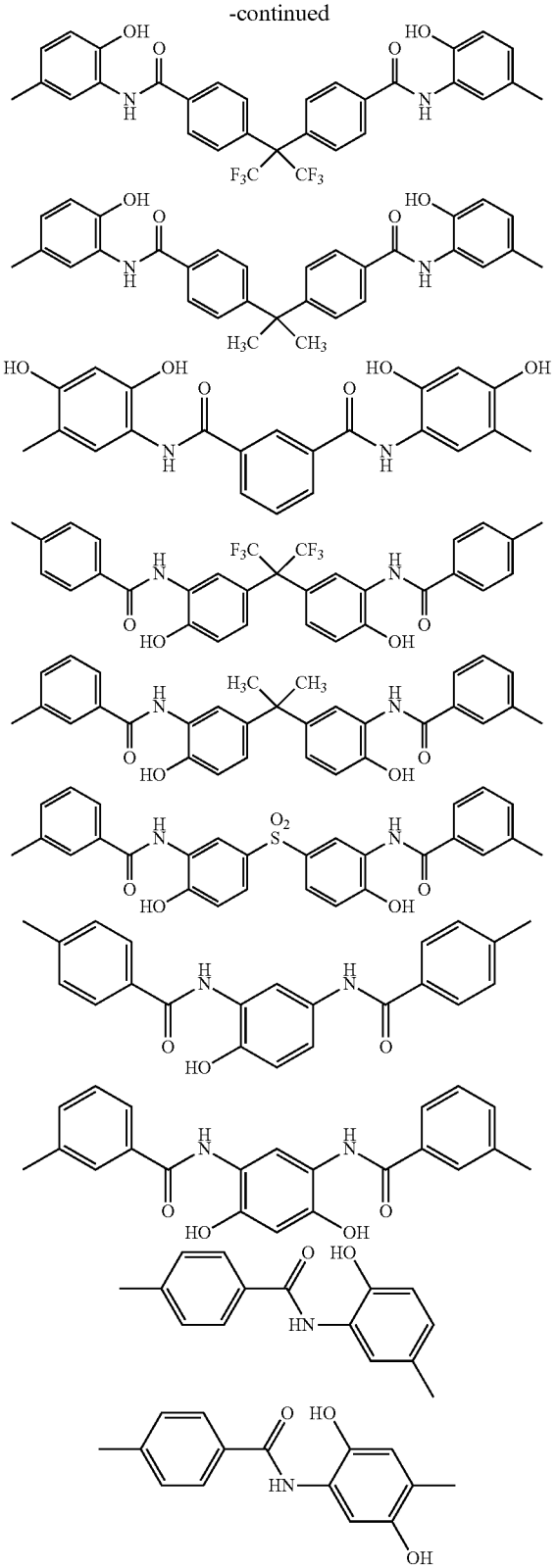

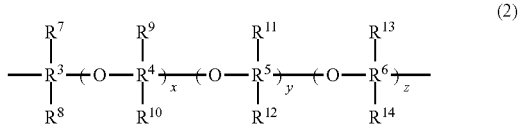

by an increased stress on a substrate wafer and a decreased interaction due to a decrease in functional groups when the dehydrating cyclization is undergone during curing.

(wherein $R^3$ to $R^6$ each independently represent a $C_1$-$C_6$ alkylene group; $R^7$ to $R^{14}$ each independently represent a hydrogen atom, fluorine atom, or $C_1$-$C_6$ alkyl group; and x, y, and z each independently represent an integer number from 0 to 35).

Examples of the diamine having the structural unit represented by the general formula (2) include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylene bis(cyclohexylamine), and 4,4'-methylene bis(2-methylcyclohexylamine); and KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700, (which are trade names; manufactured by HUNTSMAN Corporation), and the like, and diamines containing an alkylene-oxide structure are preferable in that they can increase flexibility and enhance elongation. Moreover, the diamines may contain bonds such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH—, and the like.

When a cured film is formed, the ether group in the structural unit represented by the general formula (2), which contributes to the flexibility of the structure, can provide high elongation properties to the cured film. Moreover, the presence of the ether group allows complex formation with metal ions and/or hydrogen bond formation, which provides high adhesion to metals.

The content of the polyether structural unit represented by the general formula (2) is preferably in the range of 5 to 40% by mole of the total diamine residues. The content is preferably not less than 5% by mole and more preferably not less than 10% by mole relative to the total diamine residues because such a content can ensure high elongation of the obtained cured film. Moreover, the content of the diamine having the structural unit represented by the general formula (2) is preferably not more than 40% by mole, more preferably not more than 30% by mole, and still more preferably not more than 20% by mole relative to the total diamine residues in order to maintain the solubility in an alkaline solution.

Moreover, if the molecular weight of the structural unit represented as $Y^1$ by the general formula (2) is not less than 150 in the polybenzoxazole precursor (A) used in the present invention and represented by the general formula (1) (hereinafter sometimes referred to as component (A) for short), the increase of stress on a substrate wafer, which is associ- The structural unit (A) used in the present invention preferably contains as $Y^1$ a diamine having a structural unit represented by the general formula (2) because such a structural unit (A) can suppress the reduction in the adhesion to metals (such as copper), in which the reduction is caused ated with thermal curing of the cured film, can be suppressed. That is, the flexibility of the $Y^1$ can contribute to the relief of the stress and achieve a lowered stress. Moreover, incorporation of a flexible group having a low ultraviolet absorption property can simultaneously achieve a high i-line transmittance and sensitivity improvement. The molecular weight of the structural unit represented by the general formula (2) is preferably not less than 150, more preferably not less than 600, and still more preferably not less than 900. Moreover, the molecular weight is preferably not more than 2,000, more preferably not more than 1,800, and still more preferably not more than 1,500 in order to maintain the solubility in an alkaline solution. The molecular weight is more preferably not less than 600 and not more than 1,800, and still more preferably not less than 900 and not more than 1,500. This can achieve a lower stress and a higher sensitivity.

Moreover, among alkyl ethers, tetramethylene ether group is excellent in heat resistance. Because of this, the polyether structural unit represented by the general formula (2) preferably contains the tetramethylene ether glycol structural unit. The presence of the tetramethylene ether glycol structural unit can provide metal adhesion properties after a reliability test. The content of the tetramethylene ether glycol structural unit in the polyether structural unit represented by the general formula (2) is preferably not less than 50% by mole. All the polyether structural units may be tetramethylene ether glycol structural units. Examples include, but are not limited to, RT-1000, HE-1000, HT-1100, and HT-1700, (which are trade names; manufactured by HUNTSMAN Corporation), and the like, which can be used.

The molecular weight of the component $Y^1$ in a resin based on the component (A) can be measured with respect to a diamine monomer containing the $Y^1$ structure by, for example, LC-MS and be determined as corresponding to a main signal.

Moreover, an aliphatic group having a siloxane structure may be provided for copolymerization to the extent that the heat resistance is not reduced, by which the adhesion to a substrate can be enhanced. Specific examples include those produced by copolymerization with, as a diamine component, bis(3-aminopropyl)tetramethyldisiloxane, bis(p-aminophenyl)octamethylpentasiloxane, or the like in the ratio of 1 to 15% by mole. The copolymerization with not less than 1% by mole of the diamine component will be preferable because it allows the enhancement of adhesion to a substrate such as silicon wafer, while the copolymerization with not more than 15% by mole of the diamine component will be preferable because it allows the maintenance of solubility in an alkaline solution.

The component (A) according to the present invention preferably has a weight average molecular weight of not less than 10,000 and not more than 50,000. The component (A) having a weight average molecular weight of not less than 10,000 as determined in terms of polystyrene by GPC (gel permeation chromatography) can increase the mechanical properties obtainable after curing. On the other hand, the component (A) having a weight average molecular weight of not more than 50,000 can enhance the developing property with an alkaline solution. A weight average molecular weight of not less than 20,000 is more preferable in order to provide mechanical properties. Moreover, when two or more of a polyimide precursor, a polybenzoxazole precursor, a polyimide, or a polybenzoxazole are contained, it is acceptable if at least one of them has a weight average molecular weight in the above-described range.

To increase the pot life of the positive photosensitive resin composition, the main chain termini of the component (A) are preferably capped with an end-capping agent. Examples of the end-capping agent include monoamines, acid anhydrides, monocarboxylic acids, monoacid chloride compounds, active monoester compounds, and the like. By capping the termini of the resin with an end-capping agent that contains a hydroxyl group, carboxyl group, sulfonic acid group, thiol group, vinyl group, ethynyl group, or allyl group, the dissolution rate of the resin in an alkaline solution and the mechanical properties of the resulting cured film can easily be adjusted to preferable ranges.

The ratio of the end-capping agent to be introduced is preferably not less than 0.1% by mole and particularly preferably not less than 5% by mole relative to the total amine components in order to suppress a decrease in the solubility in an alkaline solution due to the increased molecular weight of the component (A). The ratio of the end-capping agent to be introduced is preferably not more than 60% by mole and particularly preferably not more than 50% by mole in order to prevent the resulting cured film from reducing the mechanical properties due to the decreased molecular weight of the resin containing the structural unit (A). Plural different terminal groups may be introduced by allowing multiple end-capping agents to react.

Preferable examples of the monoamines used for the end-capping agents include M-600, M-1000, M-2005, and M-2070 (which are trade names; manufactured by HUNTSMAN Corporation), and aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, and the like. Two or more of them may be used in combination.

Preferable examples of the acid anhydrides, monocarboxylic acids, monoacid chloride compounds, and active monoester compounds include: acid anhydrides, such as phthalic anhydride, maleic anhydride, nadic acid anhydride, cyclohexane dicarboxylic acid anhydride, and 3-hydroxyphthalic acid anhydride; monocarboxylic acids, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, and monoacid chloride compounds produced by converting the carboxyl group of the respective compounds into an acid chloride; monoacid chloride compounds produced by converting one of the carboxyl groups in each of dicarboxylic acids, such as terephthalic acid, phthalic acid, maleic acid, cyclohexane dicarboxylic acid, 1,5-dicarboxynaphthalene, 1,6-dicarboxynaphthalene, 1,7-dicarboxynaphthalene, and 2,6-dicarboxynaphthalene, into an acid chloride; active ester compounds obtained by reaction of the respective monoacid chloride compounds with N-hydroxybenzotriazole, imidazole, N-hydroxy-5-norbornene-2,3-dicarboximide; and the like. Two or more of them may be used in combination.

An end-capping agent introduced into the component (A) used in the present invention can be easily detected by the following methods. For example, an end-capping agent used in the present invention can be easily detected by dissolving a resin, into which the end-capping agent has been introduced, in an acidic solution to decompose the resin into an amine component and an acid anhydride component, which are the constituent units of the resin, followed by the measurement of these components by gas chromatography (GC) and/or NMR. Alternatively, an end-capping agent can also be easily detected by directly analyzing a resin component, into which the end-capping agent has been introduced, by thermal pyrolytic gas chromatography (PGC) and/or infrared spectroscopy and $^{13}$C-NMR spectroscopy.

Moreover, the component (A) used in the present invention is polymerized using a solvent. The polymerization solvent is not limited to a particular type, provided that it can dissolve dicarboxylic acids, dicarboxylic acid derivatives, tetracarboxylic acid dianhydrides, and diamines, each of which is a raw material monomer. Examples of the polymerization solvent can include: amides, such as N,N-dimethylformamide, N,N-dimethylacetamide, N-methyl-2-pyrrolidone, 1,3-dimethyl-2-imidazolidinone, N,N'-dimethylpropyleneurea, N,N-dimethylisobutyramide, and methoxy-N,N-dimethylpropionamide; cyclic esters, such as γ-butyrolactone, γ-valerolactone, δ-valerolactone, γ-caprolactone, ε-caprolactone, and α-methyl-γ-butyrolactone; carbonates, such as ethylene carbonate, and propylene carbonate; glycols, such as triethyleneglycol; phenols, such as m-cresol and p-cresol; acetophenone, 1,3-dimethyl-2-imidazolidinone, sulfolane, dimethylsulfoxide, and the like.

The polymerization solvent used in the present invention is used preferably in an amount of not less than 100 parts by mass and more preferably not less than 150 parts by mass relative to 100 parts by mass of the resulting resin in order to dissolve the resin obtained after the reaction. In addition, it is used preferably in an amount of not more than 1,900 parts by mass and more preferably not more than 950 parts by mass in order to obtain the resin as powder while collecting precipitates.

The photosensitive resin composition of the present invention before curing is a positive photosensitive resin composition that contains the component (A), a compound (B) that generates an acid upon light exposure (hereinafter sometimes referred to as component (B) for short), and a heat-crosslinker (C). This positive photosensitive resin composition is not limited to a particular shape as long as it contains these components, but may be, for example, in the form of paste or sheet.

The photosensitive sheet of the present invention refers to an incompletely cured sheet-shaped material, which is soluble in an alkaline aqueous solution and is produced by applying the photosensitive resin composition of the present invention onto a support and then drying it at a temperature and for a time period in the ranges with which the solvent is allowed to completely volatilize.

The support is not particularly limited, but usually commercially available various films, such as polyethylene terephthalate (PET) film, polyphenylenesulfide film, polyimide film, and the like, can be used. Surface treatment applied to the interface between the support and the photosensitive resin composition with a silicone, silane coupling agent, aluminum chelating agent, polyurea, or the like in order to enhance the adhesion and detachability. Moreover, the thickness of the support is not particularly limited, but it is preferably in the range of 10 to 100 μm from the viewpoint of usability. Furthermore, in order to protect the surface of a photosensitive composition film obtained by application of the photosensitive resin composition, the film may have a protective film on the surface. This can protect the surface of the photosensitive resin composition from pollutants such as dirt and dust in the atmosphere.

Examples of the method to apply the photosensitive resin composition onto a support include methods such as spin-coating using a spinner, spray coating, roll coating, screen printing, blade coater method, die coater method, calender coater method, meniscus coater method, bar coater method, roll coater method, comma roll coater method, gravure coater method, screen coater method, slit die coater method, and the like. Moreover, the thickness of the coated film varies depending on the coating technique, the solid content in the composition, the viscosity, and the like, but the thickness of the film after drying is usually preferred to be not less than 0.5 and not more than 100 μm.

For drying, an oven, a hot plate, infrared light, and the like can be used. It is acceptable if the drying temperature and drying time are in the ranges with which the solvent is allowed to completely volatilize, and they are preferably set as appropriate in the ranges with which the photosensitive resin composition is left uncured or semi-cured. Specifically, drying is preferably carried out in the range of 40° C. to 150° C. and for one to tens of minutes. Moreover, a combination of temperatures included in the temperature range may be used for temperature rising in a stepwise manner, and, for example, a heat treatment may be carried out at 80° C. and at 90° C., each for two minutes.

The positive photosensitive resin composition of the present invention before curing contains a compound that generates an acid upon light exposure, that is, a photosensitive material which is a photo acid generator. The photosensitive material in the present invention is a positive-type photosensitive material that is solubilized upon light exposure, and a quinonediazide compound or the like is preferably used as a photosensitive material.

Examples of the quinonediazide compound include a polyhydroxy compound linked to a sulfonic acid group of a quinonediazide through an ester linkage, a polyamino compound linked to a sulfonic acid group of a quinonediazide through a sulfonamide linkage, a polyhydroxypolyamino compound linked to a sulfonic acid group of a quinonediazide through an ester linkage and/or a sulfonamide linkage, and the like. Not all the functional groups of the polyhydroxy compound, polyamino compound, and polyhydroxypolyamino compound may be substituted with quinonediazide, but 40% by mole or more of the total functional groups on average are preferably substituted with quinonediazide. By using such a quinonediazide compound, a positive photosensitive resin composition can be obtained, which is sensitive to i-line (wavelength: 365 nm), h-line (wavelength: 405 nm), and g-line (wavelength 436 nm) radiation from a mercury lamp, which are included in the standard ultraviolet rays.

Examples of the polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene Tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (which are trade names; manufactured by Honshu Chemical Industry Co., Ltd.); and BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (which are trade names; manufactured by Asahi Organic Chemicals Industry Co., Ltd.); and 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol, BisP-AP (which is a trade name; manufactured by Honshu Chemical Industry Co., Ltd.), novolac resins, and the like.

Examples of the polyamino compound include, but are not limited to, 1,4-phenylenediamine, 1,3-phenylenediamine, 4,4'-diaminodiphenylether, 4,4'-diaminodiphenylmethane, 4,4'-diaminodiphenylsulfone, 4,4'-diaminodiphenylsulfide, and the like.

Examples of the polyhydroxypolyamino compound include, but are not limited to, 2,2-bis(3-amino-4-hydroxyphenyl)hexafluoropropane, 3,3'-dihydroxybenzidine, and the like.

Among them, it is more preferable that the quinonediazide compound contains an ester between a phenol compound and the sulfonyl group of a 4-naphthoquinonediazide sulfonyl compound. This results in high sensitivity to i-line exposure and a higher resolution.

The content of the component (B) is preferably not less than 1 part by mass and more preferably not less than 10 parts by mass relative to 100 parts by mass of the component (A), which achieves sufficient sensitivity after exposure to light. The content of the quinonediazide compound is preferably not more than 50 parts by mass and more preferably not more than 40 parts by mass relative to 100 parts by mass of the component (A), which does not reduce film properties. It can be contemplated that a higher level of sensitivity as well as film properties of interest is achieved by specifying the content of the quinonediazide compound within this range. Furthermore, other photo acid generators such as onium salts and diaryl compounds, photosensitizers, and the like may be added as necessary.

The positive photosensitive resin composition of the present invention before curing preferably contains a heat-crosslinker (C) (hereinafter sometimes referred to as component (C) for short). Specifically, a compound having at least two alkoxymethyl or methylol groups is preferable. The presence of at least these two groups can provide a cross-linked structure obtained through condensation of the resin and a similar molecule. Moreover, the combination use with the component (B) allows exploring a wider range of designs for the purpose of improving the sensitivity and/or the mechanical properties of a cured film.

Preferable examples of the component (C) include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DMLBisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (which are trade names; manufactured by Honshu Chemical Industry Co., Ltd.); and NIKALAC (registered trademark) MX-290, NIKALAC MX-280, NIKALAC MX-270, NIKALAC MX-279, NIKALAC MW-100LM, and NIKALAC MX-750LM (which are trade names; manufactured by Sanwa Chemical Co., Ltd.). Two or more of these may be contained. Among those, HMOM-TPHAP and MW-100LM are more preferable because the addition of them will prevent reflow from occurring during curing and provide a high rectangular pattern.

The content of the component (C) is preferably not less than 5 parts by mass in order to obtain chemical resistance to a solvent and preferably not more than 40 parts by mass in order to obtain sufficient mechanical properties, relative to 100 parts by mass of the component (A). The content in this range will allow exploring a wide range of designs in a more appropriate manner for the purpose of improving the sensitivity and/or the mechanical properties of a cured film.

A low molecular weight compound having a phenolic hydroxyl group may be contained as necessary to the extent that the residual film rate after shrinkage during curing is not decreased. This allows the developing time to be shortened.

Examples of these compounds include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylene Tris-FR-CR, and BisRS-26X (which are trade names; Honshu Chemical Industry Co., Ltd.); and BIP-PC, BIR-PC, BIR-PTBP, and BIR-BIPC-F (which are trade names; manufactured by Asahi Organic Chemicals Industry Co., Ltd.); and the like. Two or more of these may be contained.

The low molecular weight compound having a phenolic hydroxyl group is preferably contained at a content of 1 to 40 parts by mass relative to 100 parts by mass of the component (A).

The photosensitive resin composition of the present invention before curing preferably contains a compound (D) represented by the general formula (3) (hereinafter sometimes referred to as component (D) for short). The presence of the component (D) significantly enhances the adhesion of a heat-cured film to metal materials, especially to copper. This enhanced adhesion is attributed to the efficient interaction of S and/or N atoms in the compound represented by the general formula (3) with the metal surface, and furthermore to the conformation of the compound which promotes the interaction with the metal surface. Based on these effects, a cured film excellent in adhesion to metal materials can be obtained from the positive photosensitive resin composition of the present invention. Examples of $R^{18}$ to $R^{20}$ in the general formula (3) include hydrogen atom, alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, combinations thereof, and the like, and they optionally contain a substituent.

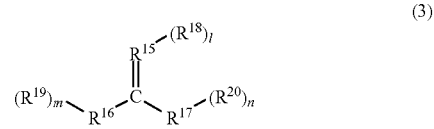

(3)

(wherein, in the general formula (3), $R^{15}$ to $R^{17}$ represent an oxygen, sulfur, or nitrogen atom, provided that at least one of $R^{15}$ to $R^{17}$ represents a sulfur atom; l is 0 or 1; m and n represent an integer number from 0 to 2; and $R^{18}$ to $R^{20}$ each independently represent a hydrogen atom or a $C_1$-$C_{20}$ organic group).

The content of the component (D) is preferably 0.1 to 10 parts by mass relative to 100 parts by mass of the component (A). Preferably, the content of not less than 0.1 parts by mass can sufficiently provide an adhesive effect on metal materials, while, if the photosensitive resin composition used in the present invention is a positive photosensitive resin composition, the content of not more than 10 parts by mass can suppress a decrease in the sensitivity of the positive photosensitive resin composition before curing based on the interaction with the photosensitive material.

In the component (D) used in the present invention, $R^{15}$ to $R^{17}$ represent an oxygen, sulfur, or nitrogen atom, and at least one of $R^{15}$ to $R^{17}$ preferably represents a sulfur atom. In general, in cases where a compound containing a nitrogen atom is added, the interaction between the photosensitive material and the nitrogen-containing compound may reduce the sensitivity. However, the presence of sulfur atom can lower the effect of the interaction with the photosensitive material, by which the enhancing effect on the adhesion can be obtained without reducing the sensitivity of the positive photosensitive resin composition before curing. Moreover, a trialkoxymethyl group is more preferably contained from the viewpoint of the adhesion to substrates other than metals.

Examples of the compound represented by the general formula (3) include, but are not limited to, the following structures.

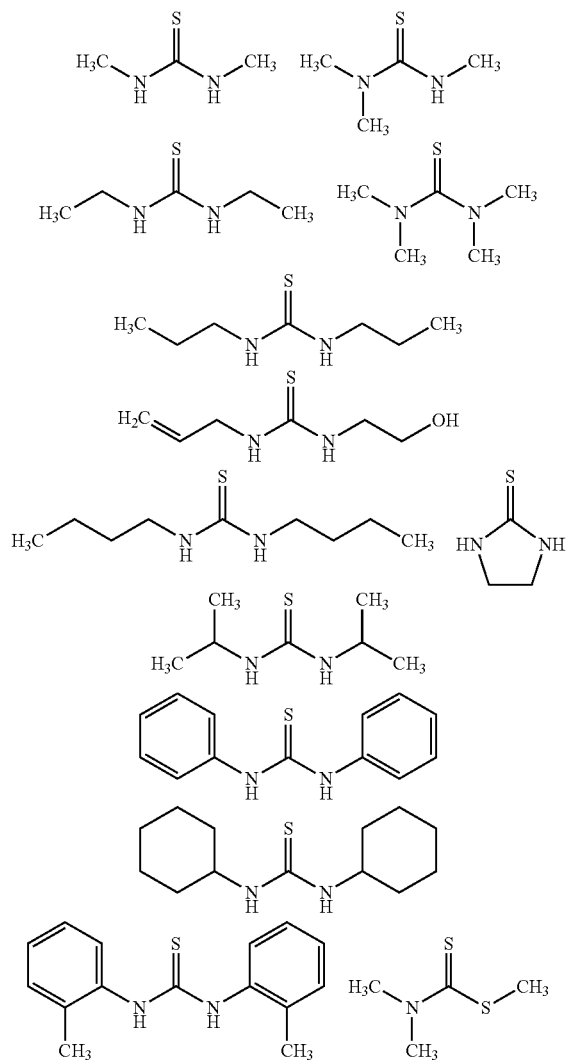

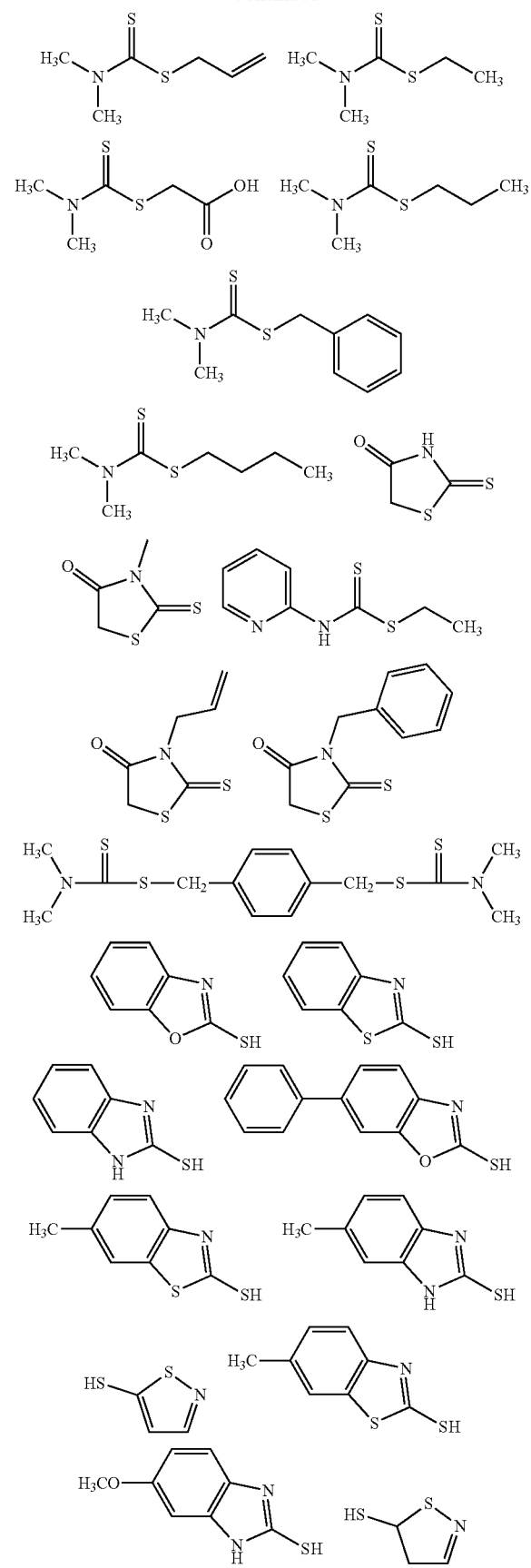

-continued
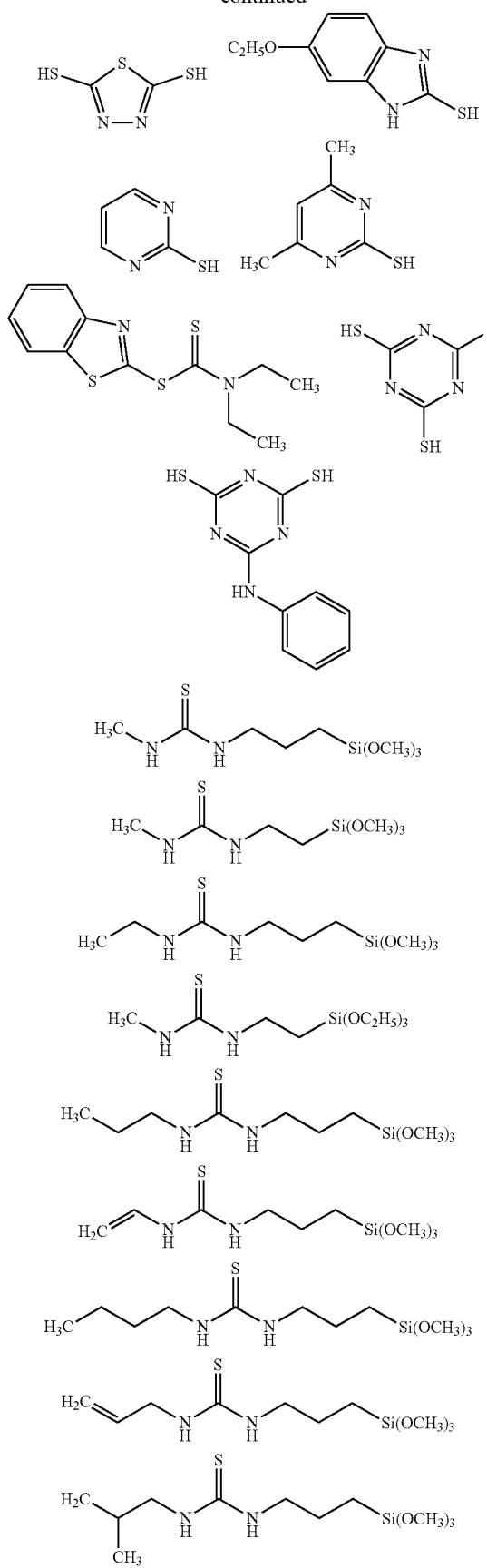
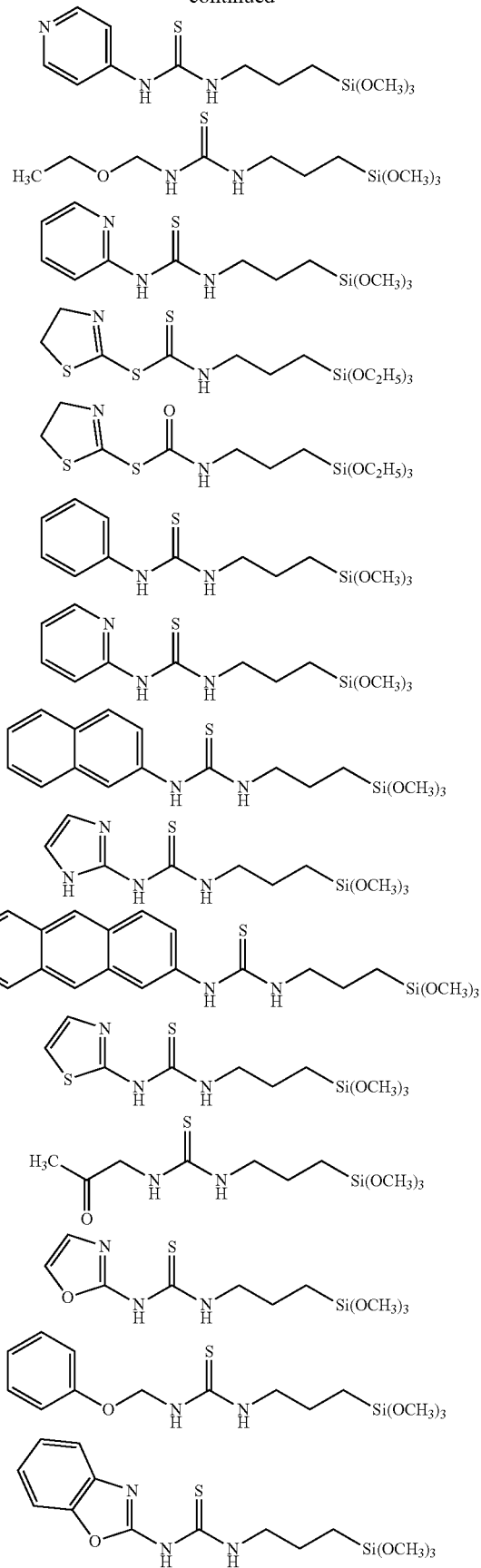

-continued

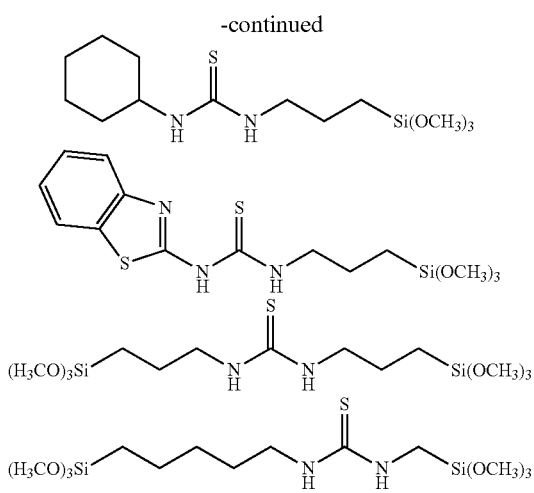

In addition, the component (B), the component (C), and the component (D) in the cured film according to the present invention can be subjected to degas analysis of the cured film (for example, pyrolytic decomposition GC/MS) to thereby detect the respective component residues.

The positive photosensitive resin composition of the present invention before curing preferably contains a compound (E) represented by the general formula (4) below (hereinafter sometimes referred to as component (E) for short). The presence of the component (E) can suppress deterioration of the mechanical properties of a cured film after a reliability test and/or of the adhesion to metal materials.

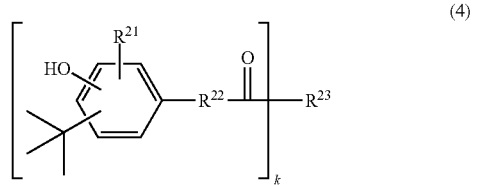

(wherein, in the general formula (4), $R^{21}$ represents a hydrogen atom or an alkyl group containing two or more carbon atoms; $R^{22}$ represents an alkylene group containing two or more carbon atoms; $R^{23}$ represents an organic group having one to four valences and comprising at least any of an alkylene group containing two or more carbon atoms, oxygen atom, and nitrogen atom; and k represents an integer number from 1 to 4.)

The component (E) works as an antioxidant to suppress oxidative degradation of the aliphatic group and phenolic hydroxyl group of the component (A). Moreover, the rust preventing action on metal materials can inhibit oxidation of metal materials.

In the component (E) used in the present invention, $R^{21}$ represents a hydrogen atom or an alkyl group containing two or more carbon atoms, and $R^{22}$ represents an alkylene group containing two or more carbon atoms. $R^{23}$ represents an organic group having one to four valences and comprising at least any of an alkylene group containing two or more carbon atoms, oxygen atom, and nitrogen atom. k represents an integer number from 1 to 4. The component can interact with both the component (A) in a cured film and a metal material to enhance the adhesion of the cured film to the metal material. For a more efficient interaction with both the component (A) in a cured film and a metal material, k is more preferably an integer number from 2 to 4. Examples of $R^{23}$ include alkyl group, cycloalkyl group, aryl group, aryl ether group, carboxyl group, carbonyl group, allyl group, vinyl group, heterocyclic group, —O—, —NH—, —NHNH—, or combinations thereof, and the like, and they optionally contain a substituent. Among those, alkyl ether and —NH— are preferably contained in terms of the solubility in a developer solution and/or the adhesion to metals, while —NH— is more preferably contained in terms of the interaction with the component (A) and the adhesion to metals based on the formation of a metal complex.

The content of the component (E) is preferably from 0.1 to 10 parts by mass and more preferably from 0.5 to 5 parts by mass relative to 100 parts by mass of the component (A). The content of not less than 0.1 parts by mass is preferable because it allows suppression of oxidative degradation of an aliphatic group and a phenolic hydroxyl group and, moreover, inhibition of oxidation of metal materials based on the rust preventing action on metal materials. Preferably, the content of not more than 10 parts by mass can suppress a decrease in the sensitivity of the positive photosensitive resin composition before curing, due to the interaction with photosensitive material.

Examples of the component (E) include, but are not limited to, the following structures.

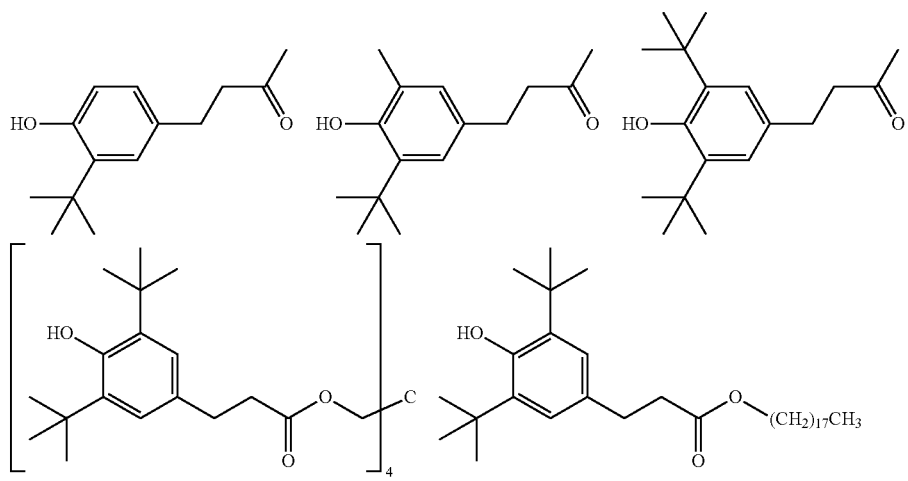

-continued
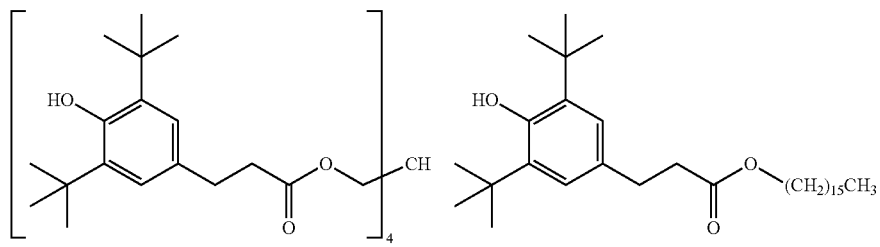
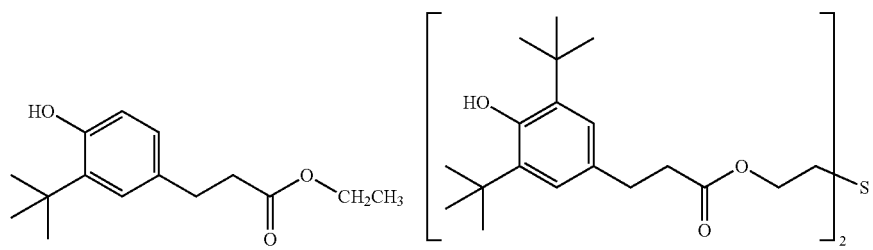
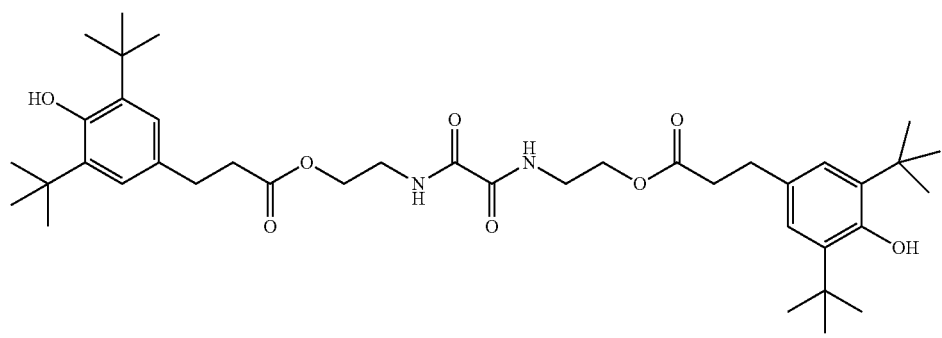
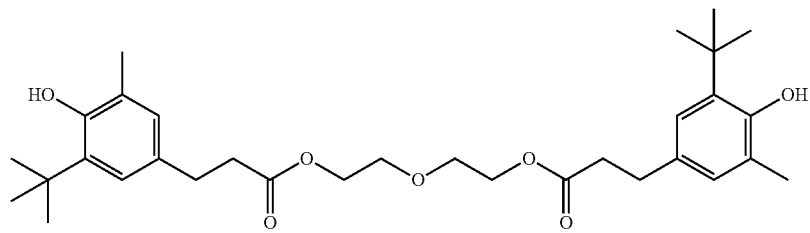
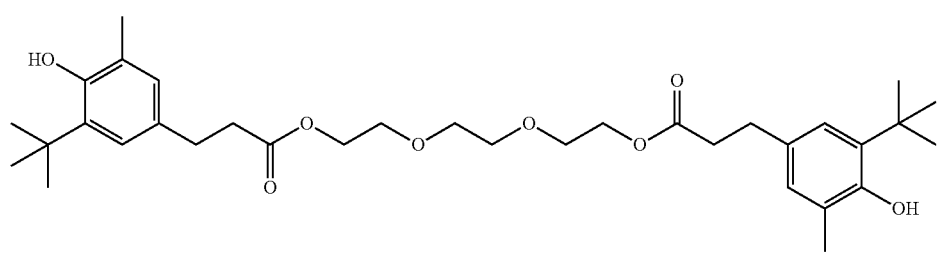
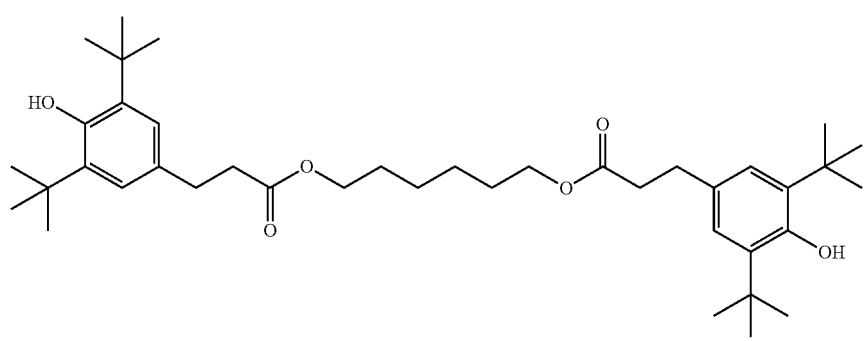

-continued
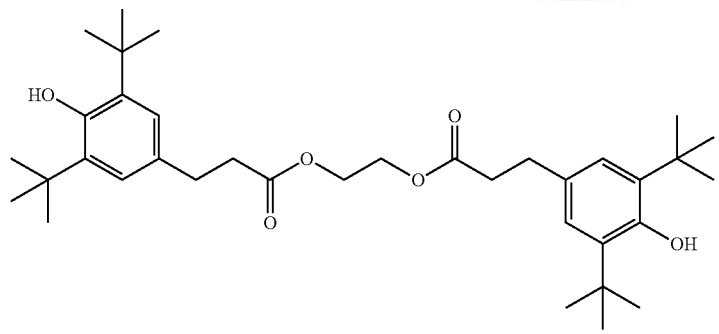
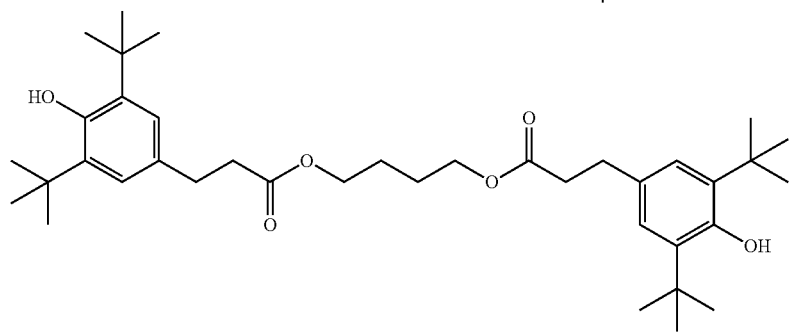
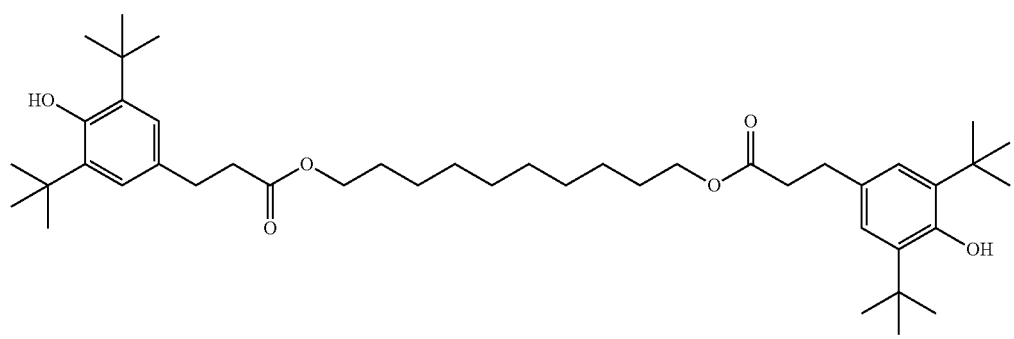
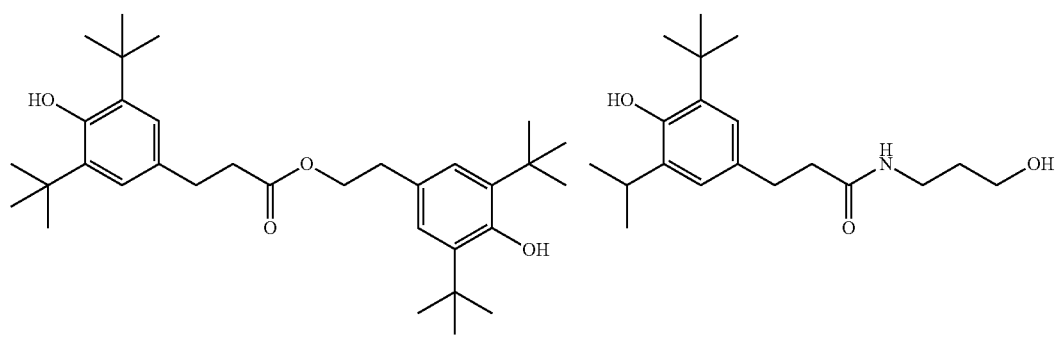
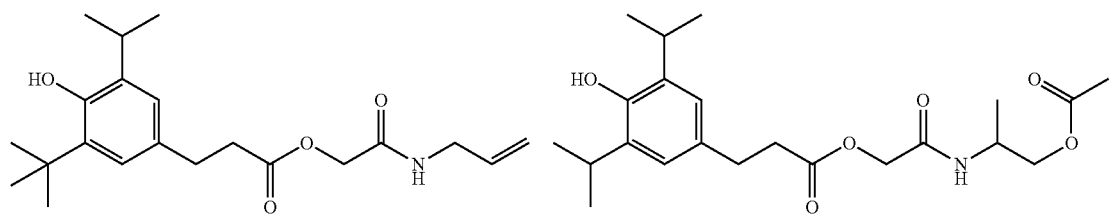

-continued
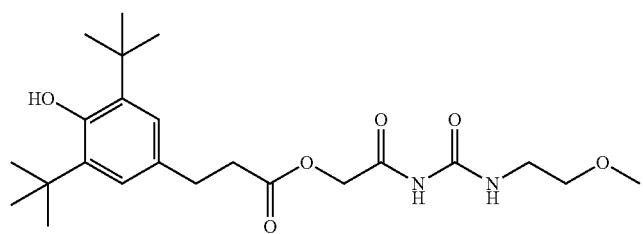
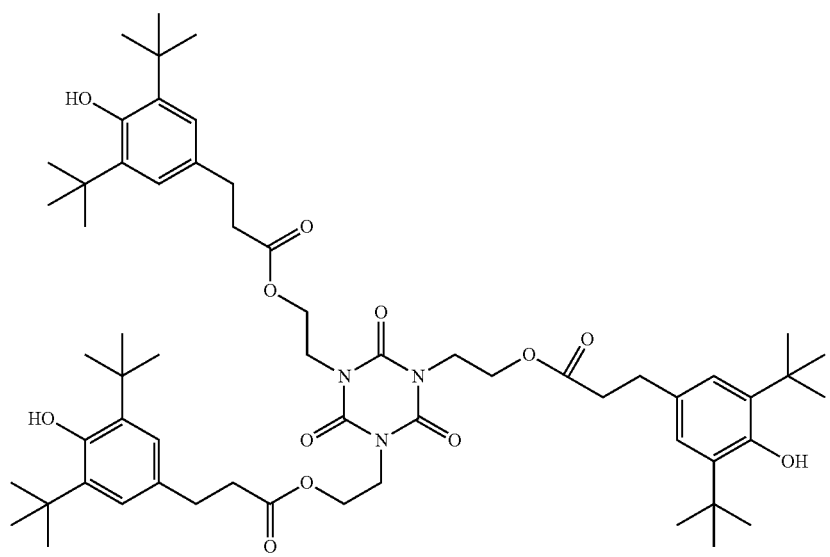
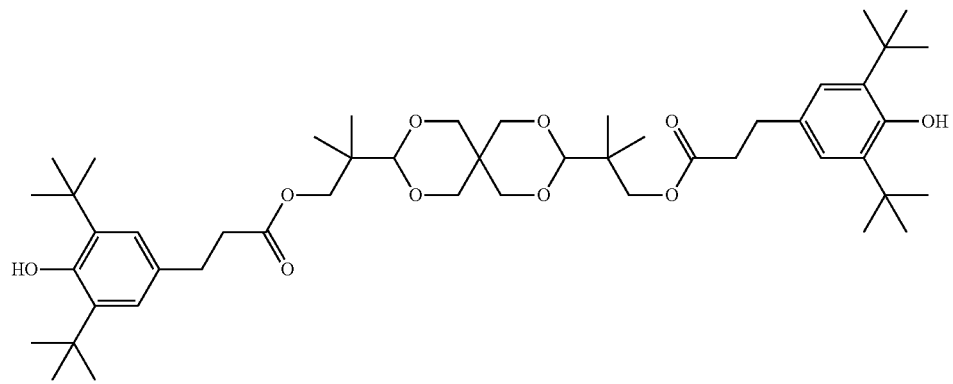
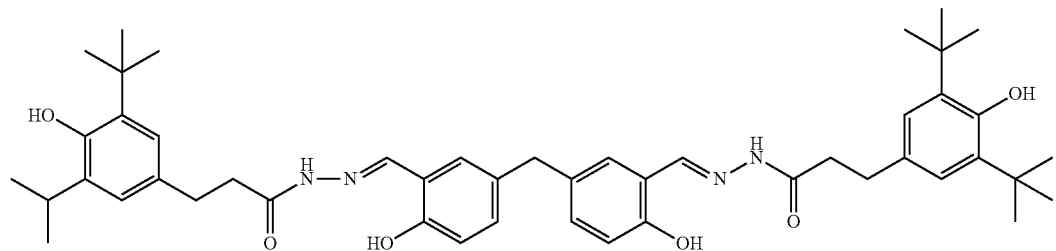

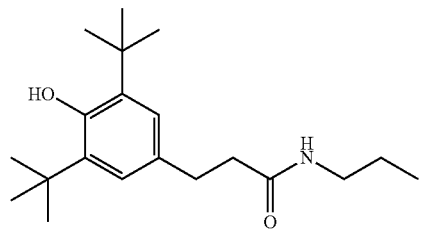
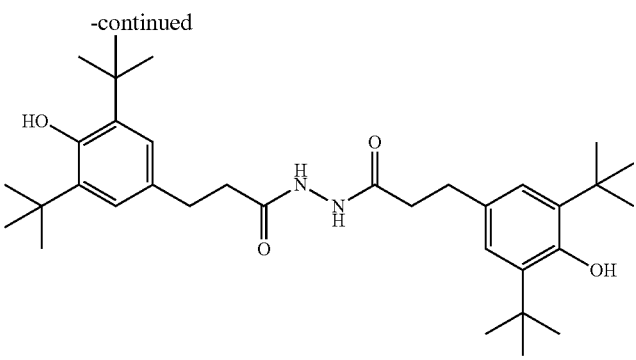
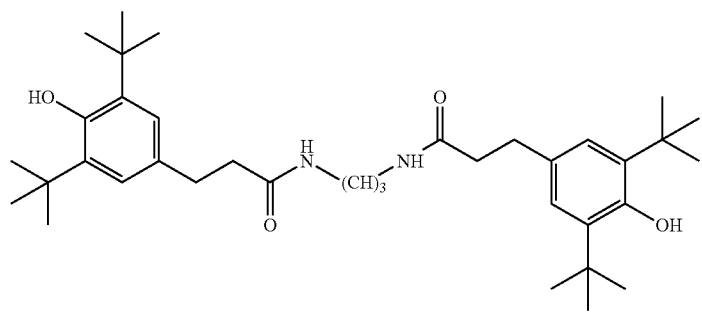
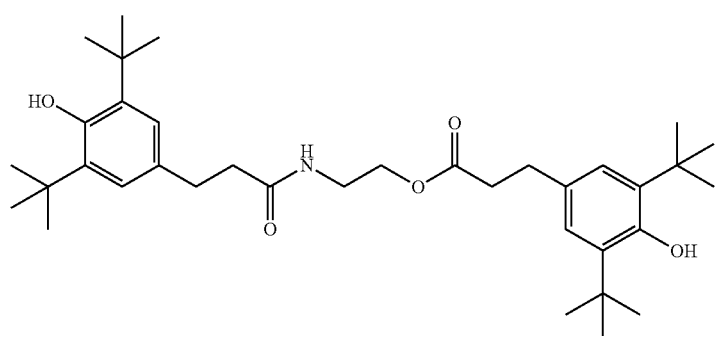
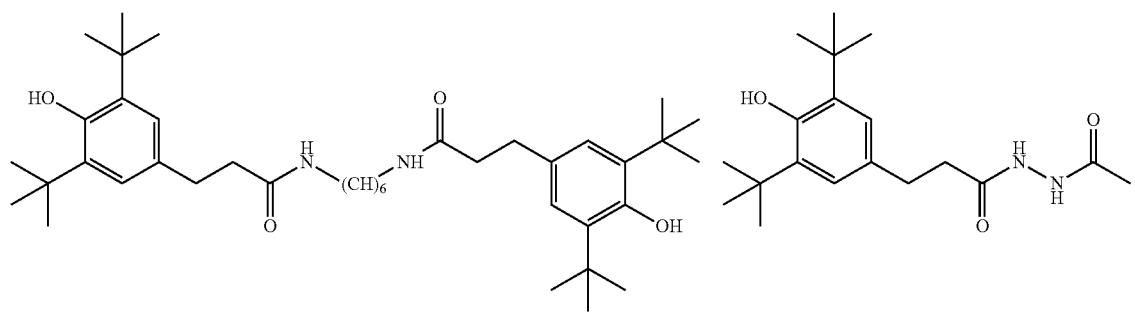
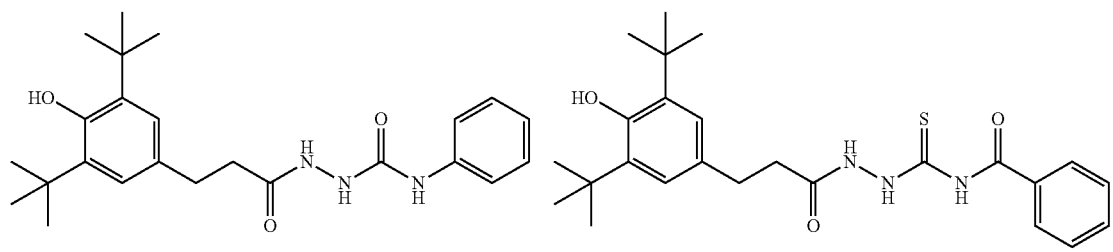

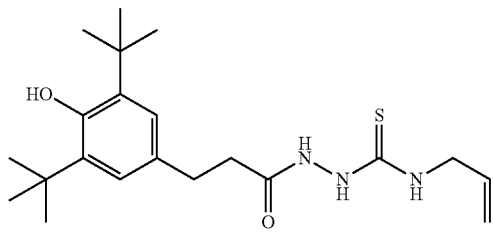

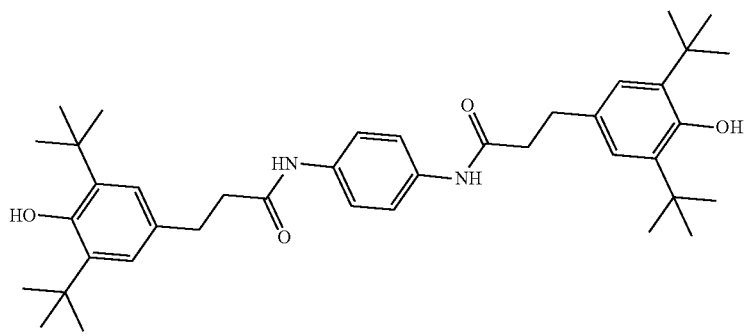

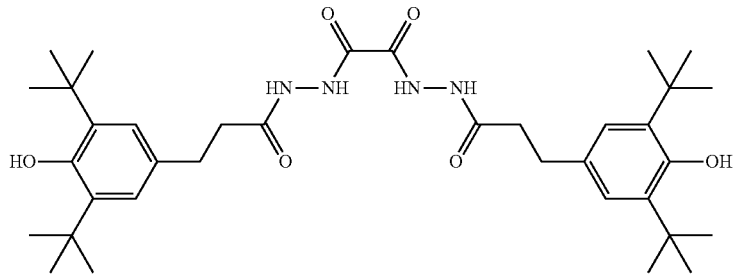

The positive photosensitive resin composition of the present invention before curing preferably contains a heat-crosslinker (F) having a structural unit represented by the general formula (5) (hereinafter sometimes referred to as component (F) for short). The presence of the component (F) allows further improvement of mechanical properties and reduction of stress to be achieved.

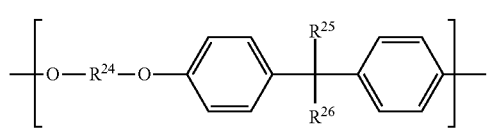

(5)

(wherein, in the general formula (5), $R^{25}$ and $R^{26}$ each independently represent a hydrogen atom or methyl group; and $R^{24}$ is a divalent organic group comprising an alkylene group containing two or more carbon atoms, which may be linear, branched, or cyclic).

In the component (F) used in the present invention, $R^{25}$ and $R^{26}$ each independently represent a hydrogen atom or methyl group. $R^{24}$ is a divalent organic group comprising an alkylene group containing two or more carbon atoms, which may be linear, branched, or cyclic. Examples of $R^{24}$ include alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, combinations thereof, and the like, and they optionally contain a substituent.

Since the component (F) used in the present invention contains a flexible alkylene group and rigid aromatic groups, the component has a heat resistance and allows improvement of mechanical properties and reduction of stress in a cured film to be achieved. Examples of the crosslink group include, but are not limited to, acrylic group, methylol group, alkoxymethyl group, and epoxy group. Among those, epoxy group is preferable because it can react with the phenolic hydroxyl group of the component (A) to improve the heat resistance of a cured film and to prevent film shrinkage caused by dehydration, which reduces the stress generated on a substrate.

Examples of the component (F) used in the present invention include, but are not limited to, the following structures:

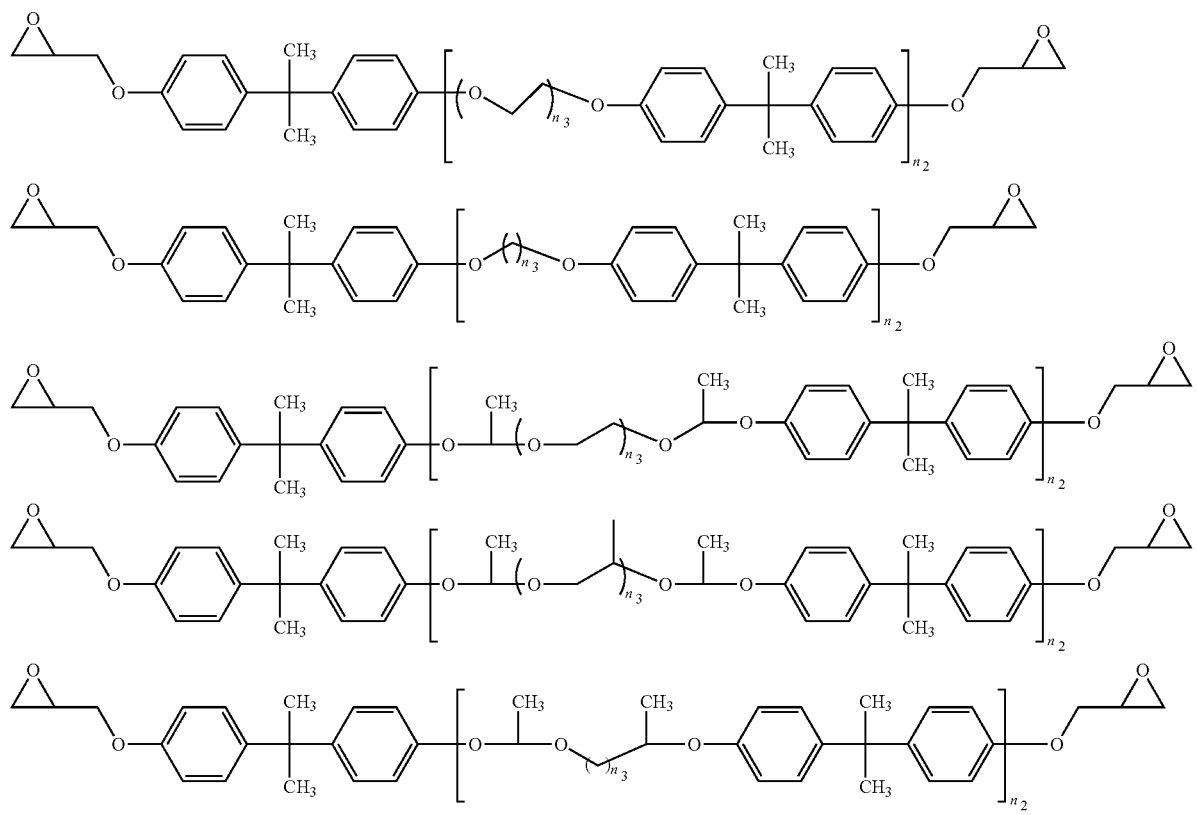

(wherein $n_2$ is an integer number from 1 to 5, and $n_3$ is an integer number from 1 to 20).

Among the structures described above, it is preferable for the component (F) used in the present invention to cope with the heat resistance and the mechanical properties that $n_2$ is from 1 to 2 and $n_3$ is from 3 to 7.

The content of the component (F) is preferably from 2 to 35 parts by mass and more preferably from 5 to 25 parts by mass relative to 100 parts by mass of the component (A). The content of not less than 2 can provide effects for improving mechanical properties and lowering the stress, while the content of not more than 35 parts by mass can suppress a decrease in the sensitivity of the positive photosensitive resin composition before curing.

Relative to 100 parts by mass of the component (F) used in the present invention, the content of the component (E) used in the present invention is preferably in the range of 10 parts by mass to 50 parts by mass. The content in this range will be able to suppress degradation of the alkylene group after a reliability test and thus to suppress deterioration of the mechanical properties of a cured film after a reliability test.

The positive photosensitive resin composition of the present invention before curing preferably contains a solvent. Examples of the solvent include: polar aprotic solvents, such as N-methyl-2-pyrrolidone, γ-butyrolactone, γ-valerolactone, δ-valerolactone, N,N-dimethylformamide, N,N-dimethylacetamide, dimethylsulfoxide, 1,3-dimethyl-2-imidazolidinone, N,N'-dimethylpropyleneurea, N,N-dimethylisobutyramide, and methoxy-N,N-dimethylpropionamide; ethers, such as tetrahydrofuran, dioxane, propyleneglycolmonomethylether, and propyleneglycolmonoethylether; ketones, such as acetone, methylethylketone, and diisobutylketone; esters, such as ethylacetate, butylacetate, isobutylacetate, propylacetate, propyleneglycolmonomethyletheracetate, and 3-methyl-3-methoxybutylacetate; alcohols, such as ethyllactate, methyllactate, diacetonealcohol, and 3-methyl-3-methoxybutanol; aromatic hydrocarbons, such as toluene and xylene; and the like. Two or more of these may be contained.

Relative to 100 parts by mass of the component (A), the content of the solvent is preferably not less than 100 parts by mass to dissolve the composition, while it is preferably not more than 1,500 parts by mass to form a coated film having a film thickness of not less than 1 μm.

A cured film formed by curing the positive photosensitive resin composition of the present invention may contain, as needed, surfactants; esters, such as ethyllactate and propyleneglycolmonomethyletheracetate; alcohols, such as ethanol; ketones, such as cyclohexanone and methylisobutylketone; and ethers, such as tetrahydrofuran and dioxane, for the purpose of improving the wettability with a substrate.

Moreover, in order to enhance adhesion to a substrate, a cured film formed by curing the positive photosensitive resin composition of the present invention may contain, as a silicon component, a silane coupling agent such as trimethoxyaminopropylsilane, trimethoxyepoxysilane, trimethoxyvinylsilane, trimethoxythiolpropylsilane, or the like, to the extent that the pot life is not compromised. The content of the silane coupling agent is preferably from 0.01 to 5 parts by mass relative to 100 parts by mass of a resin having the structural unit (A).

A cured film formed by curing the positive photosensitive resin composition of the present invention may contain an alkali-soluble resin other than the component (A). Specific examples include alkali-soluble polyimides, polybenzoxazoles, acrylic polymers obtained by copolymerization of an acrylic acid, novolac resins, siloxane resins, and the like. Such resins are soluble in an alkaline solution such as tetramethylammonium hydroxide, choline, triethylamine, dimethylaminopyridine, monoethanolamine, diethylaminoethanol, sodium hydroxide, potassium hydroxide, sodium carbonate, or the like. The presence of any of these alkali-soluble resins can provide a cured film with the properties of each alkali-soluble resin while maintaining the adhesion property and excellent sensitivity of the cured film.

The viscosity of the positive photosensitive resin composition of the present invention before curing is preferably from 2 to 5,000 mPa·s. By adjusting the solid content to give a viscosity of not less than 2 mPa·s, a desired film thickness is easily obtained. On the other hand, the viscosity of not more than 5,000 mPa·s will facilitate obtaining a coated film of highly uniform thickness. A positive photosensitive resin composition having such a viscosity can easily be obtained by adjusting the solid content, for example, to 5 to 60% by mass.

The component (A) in a cured film formed by curing the photosensitive resin composition used in the present invention may be copolymerized with another structure such as polyimide, as long as the structure contains a structural unit represented by the general formula (1). Examples of the monomer to be copolymerized include, as an acid dianhydride, pyromellitic acid dianhydride, 2,3,5,6-pyridinetetracarboxylic acid dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl) methane dianhydride, bis(2,3-dicarboxyphenyl)methane dianhydride, bis(3,4-dicarboxyphenyl)sulfone dianhydride, 2,2-bis[4-(3,4-dicarboxyphenoxy)phenyl]propane dianhydride, 2,2-bis[4-(2,3-dicarboxyphenoxy)phenyl]propane dianhydride, 2,2-bis[4-(3,4-dicarboxyphenoxy)phenyl] sulfone dianhydride, 1,2,5,6-naphthalenetetracarboxylic acid dianhydride, 1,4,5,8-naphthalenetetracarboxylic acid dianhydride, 2,3,6,7-naphthalenetetracarboxylic acid dianhydride, 2,3,6,7-naphthalenetetracarboxylic acid dianhydride, 3,4,9,10-perylenetetracarboxylic dianhydride, p-phenylene bis(trimellitic acid monoester dianhydride), p-biphenylene bis(trimellitic acid monoester dianhydride), ethylene bis(trimellitic acid monoester dianhydride), bisphenol A bis(trimellitic acid monoester dianhydride), butanetetracarboxylic acid dianhydride, cyclobutanetetracarboxylic dianhydride, 1,2,3,4-cyclopentanetetracarboxylic acid dianhydride, 1,2,4,5-cyclohexanetetracarboxylic dianhydride, bicyclo[2.2.1.]heptanetetracarboxylic acid dianhydride, bicyclo[3.3.1.]tetracarboxylic acid dianhydride, bicyclo[3.1.1.]hept-2-ene tetracarboxylic acid dianhydride, bicyclo[2.2.2.]octanetetracarboxylic acid dianhydride, adamantanetetracarboxylic acid, 4,4'-(fluorenyl)diphthalic acid anhydride, 3,4'-oxydiphthalic acid anhydride, 4,4'-oxydiphthalic acid anhydride, 4,4'-(hexafluoroisopropylidene)diphthalic acid anhydride, and the like.

Examples of the diamine include, but are not limited to, m-phenylenediamine, p-phenylenediamine, 3,5-diaminobenzoic acid, 1,5-naphthalenediamine, 2,6-naphthalenediamine, 9,10-anthracenediamine, 2,7-diaminofluorene, 4,4'-diaminobenzanilide, 3,4'-diaminodiphenylether, 4,4'-diaminodiphenylether, 3-carboxy-4,4'-diaminodiphenylether, 3-sulfonic acid-4,4'-diaminodiphenylether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 4-aminobenzoic acid 4-aminophenyl ester, 9,9-bis(4-aminophenyl)fluorene, 1,3-bis(4-anilino)tetramethyldisiloxane, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, bis(4-aminophenoxyphenyl)sulfone, bis(3-aminophenoxyphenyl)sulfone, bis(4-aminophenoxy)biphenyl, bis[4-(4-aminophenoxy)phenyl]ether, 2,2-bis[4-(4-aminophenoxy)phenyl]propane, 2,2-bis[4-(4-aminophenoxy)phenyl]hexafluoropropane, 1,4-bis(4-aminophenoxy)benzene, 1,3-bis(3-aminophenoxy)benzene, 1,3-bis(4-aminophenoxy)benzene, bis(3-amino-4-hydroxyphenyl) sulfone, bis(3-amino-4-hydroxyphenyl)propane, bis(3-amino-4-hydroxyphenyl)hexafluoropropane, bis(3-amino-4-hydroxyphenyl)methylene, bis(3-amino-4-hydroxyphenyl) ether, bis(3-amino-4-hydroxy)biphenyl, 4,4'-diamino-6,6'-bis(trifluoromethyl)-[1,1'-biphenyl]-3,3'-diol, 9,9-bis(3-amino-4-hydroxyphenyl)fluorene, 2,2'-bis[N-(3-aminobenzoyl)-3-amino-4-hydroxyphenyl]propane, 2,2'-bis[N-(3-aminobenzoyl)-3-amino-4-hydroxyphenyl] hexafluoropropane, 2,2'-bis[N-(4-aminobenzoyl)-3-amino-4-hydroxyphenyl]propane, 2,2'-bis[N-(4-aminobenzoyl)-3-amino-4-hydroxyphenyl]hexafluoropropane, bis[N-(3-aminobenzoyl)-3-amino-4-hydroxyphenyl]sulfone, bis[N-(4-aminobenzoyl)-3-amino-4-hydroxyphenyl]sulfone, 9,9-bis[N-(3-aminobenzoyl)-3-amino-4-hydroxyphenyl] fluorene, 9,9-bis[N-(4-aminobenzoyl)-3-amino-4-hydroxyphenyl]fluorene, N,N'-bis(3-aminobenzoyl)-2,5-diamino-1,4-dihydroxybenzene, N,N'-bis(4-aminobenzoyl)-2,5-diamino-1,4-dihydroxybenzene, N,N'-bis(4-aminobenzoyl)-4,4'-diamino-3,3-dihydroxybiphenyl, N,N'-bis(3-aminobenzoyl)-3,3'-diamino-4,4-dihydroxybiphenyl, N,N'-bis(4-aminobenzoyl)-3,3'-diamino-4,4-dihydroxybiphenyl, 2-(4-aminophenyl)-5-aminobenzoxazole, 2-(3-aminophenyl)-5-aminobenzoxazole, 2-(4-aminophenyl)-6-aminobenzoxazole, 2-(3-aminophenyl)-6-aminobenzoxazole, 1,4-bis(5-amino-2-benzoxazolyl)benzene, 1,4-bis(6-amino-2-benzoxazolyl)benzene, 1,3-bis(5-amino-2-benzoxazolyl) benzene, 1,3-bis(6-amino-2-benzoxazolyl)benzene, 2,6-bis (4-aminophenyl)benzobisoxazole, 2,6-bis(3-aminophenyl) benzobisoxazole, bis[(3-aminophenyl)-5-benzoxazolyl], bis [(4-aminophenyl)-5-benzoxazolyl], bis[(3-aminophenyl)-6-benzoxazolyl], bis[(4-aminophenyl)-6-benzoxazolyl], and the like. Two or more of them may be used in combination.

For the polybenzoxazole precursor, the ring closure rate is preferably not less than 10% and not more than 60%. It is preferable to use a ring closure rate within this range in that it can provide the obtained cured film with high chemical resistance to resist removing liquids without losing the adhesion of the film to metals, and reduces the intermolecular interactions between the molecular chains by virtue of the steric hindrance between molecular chains by the amide groups of the polybenzoxazole precursor, thereby imparting high elongation to the obtained cured film.

Next, a method of forming a heat-resistant resin pattern will be described, in which the photosensitive resin composition of the present invention before curing is used.

The photosensitive resin composition of the present invention before curing is applied onto a substrate. Without limitation, examples of substrates to be used include metal-copper-plated substrates, silicon wafers, and the like, and examples of materials to be used include ceramics, gallium arsenide, and the like. Examples of the method for application include methods such as spincoating using a spinner, spray coating, roll coating, and the like. Moreover, the thickness of the coated film varies depending on the coating technique, the solid content in the composition, the viscosity, and the like, but the composition is usually applied such that the thickness of the film after drying is from 0.1 to 150 µm.

In order to enhance the adhesion between a substrate and the photosensitive resin composition, the substrate can also be subjected to a pre-treatment with the above-described silane coupling agent. For example, a surface treatment is carried out by spincoating, dipping, spray coating, vaper treatment, or the like with a silane coupling agent dissolved in a solvent, such as isopropanol, ethanol, methanol, water, tetrahydrofuran, propyleneglycolmonomethyletheracetate, propyleneglycolmonomethylether, ethyllactate, or diethyl adipate, to a concentration of 0.5 to 20% by mass. In some cases, a heat treatment up to 50-300° C. is subsequently carried out to promote the reaction between the substrate and the silane coupling agent.

Then, the substrate coated with the photosensitive resin composition is dried to obtain a photosensitive resin composition film. For drying, an oven, hot plate, infrared light, or the like is preferably used at a temperature in the range of 50° C. to 150° C. for one minute to several hours.

Then, this photosensitive resin composition film is exposed to actinic irradiation through a mask of a desired pattern. Examples of the actinic rays used for the exposure include ultraviolet rays, visible rays, electron beams, X-rays, and the like. In the present invention, i-line (365 nm), h-line (405 nm), or g-line (436 nm) radiation from a mercury lamp is preferably used.

After the exposure, the exposed portion is removed for forming a resin pattern by using a developer solution. Examples of a preferable developer solution include alkaline solutions of compounds such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethylacetate, dimethylaminoethanol, dimethylaminoethylmethacrylate, cyclohexylamine, ethylenediamine, hexamethylenediamine, and the like. In some cases, these alkaline solutions may be supplemented with a single kind of, or a combination of several kinds of, polar solvents such as N-methyl-2-pyrrolidone, N,N-dimethylformamide, N,N-dimethylacetamide, dimethylsulfoxide, γ-butyrolactone, and dimethylacrylamide; alcohols such as methanol, ethanol, and isopropanol; esters such as ethyllactate and propyleneglycolmonomethyletheracetate; ketones such as cyclopentanone, cyclohexanone, isobutylketones, and methylisobutylketone; and the like. After development, a rinse treatment is preferably carried out with water. Here, alcohols such as ethanol and isopropyl alcohol; esters such as ethyllactate and propyleneglycolmonomethyletheracetate; and the like may also be added to water for use in the rinse treatment.

After development, a heat-crosslinking reaction is promoted by applying a temperature of 150° C. to 320° C. to improve heat resistance and chemical resistance. This heat treatment is carried out for five minutes to five hours by first choosing temperatures and then increasing temperature in a stepwise manner, or by first choosing a certain temperature range and then continuously increasing temperature in the range. As one example, a heat treatment is carried out at 130° C. and at 200° C., each for 30 minutes. In the present invention, the lower temperature limit of the curing conditions is preferably not lower than 170° C. and more preferably not lower than 180° C. to sufficiently promote curing. Moreover, the upper temperature limit of the curing conditions is preferably not higher than 280° C. and more preferably not higher than 250° C. because the present invention provides a cured film exhibiting an excellent curability especially at a low temperature.

A heat-resistant resin film produced from the photosensitive resin composition of the present invention can be used in electronic components such as semiconductor devices and multilayer wiring boards. Specifically, the heat-resistant resin film is suitably used for applications including, but not limited to, passivation films for semiconductors, surface protection films for semiconductor devices, interlayer insulating films for semiconductor devices, interlayer insulating films for multilayer wiring for high-density mounting, insulating layers for organic electroluminescent devices, and the like, and can be used in various structures.

Next, examples of the use of a cured film formed by curing the photosensitive resin composition of the present invention will be described by way of drawings, in which the cured film is applied to a semiconductor device having a bump. FIG. 1 is an enlarged cross-sectional view of a pad portion of a semiconductor device of the present invention having a bump. As illustrated in FIG. 1, a passivation film 3 is formed on an aluminum (hereinafter referred to as Al for short) pad 2 for input/output on a silicon wafer 1, and a viahole is formed on the passivation film 3. On this film, an insulating film 4 is formed into a pattern that is made of a cured film formed by curing the photosensitive resin composition of the present invention, and further on this film, a metal film (Cr, Ti, or the like) 5 is formed so as to be connected with the Al pad 2, and a metal line (Al, Cu, or the like) 6 is formed by electroplating or the like. By etching the metal film 5 around a solder bump 10, insulation is established between pads. On the insulated pad, a barrier metal 8 and the solder bump 10 are formed. An insulating film 7 of a cured film formed by curing the photosensitive resin composition can undergo thick film processing at a scribe line 9. In cases where a flexible component is introduced in the cured film formed by curing the photosensitive resin composition, the warpage of the resulting wafer is small and, hence, light exposure and wafer transfer can be carried out with high precision. Moreover, because the resin of the present invention also has excellent mechanical properties, the stress from the molding resin can also be released while the resin of the present invention is mounted, and thus any damage to the low-k layer can be prevented and semiconductor devices of high reliability can be provided.

Figure 2:
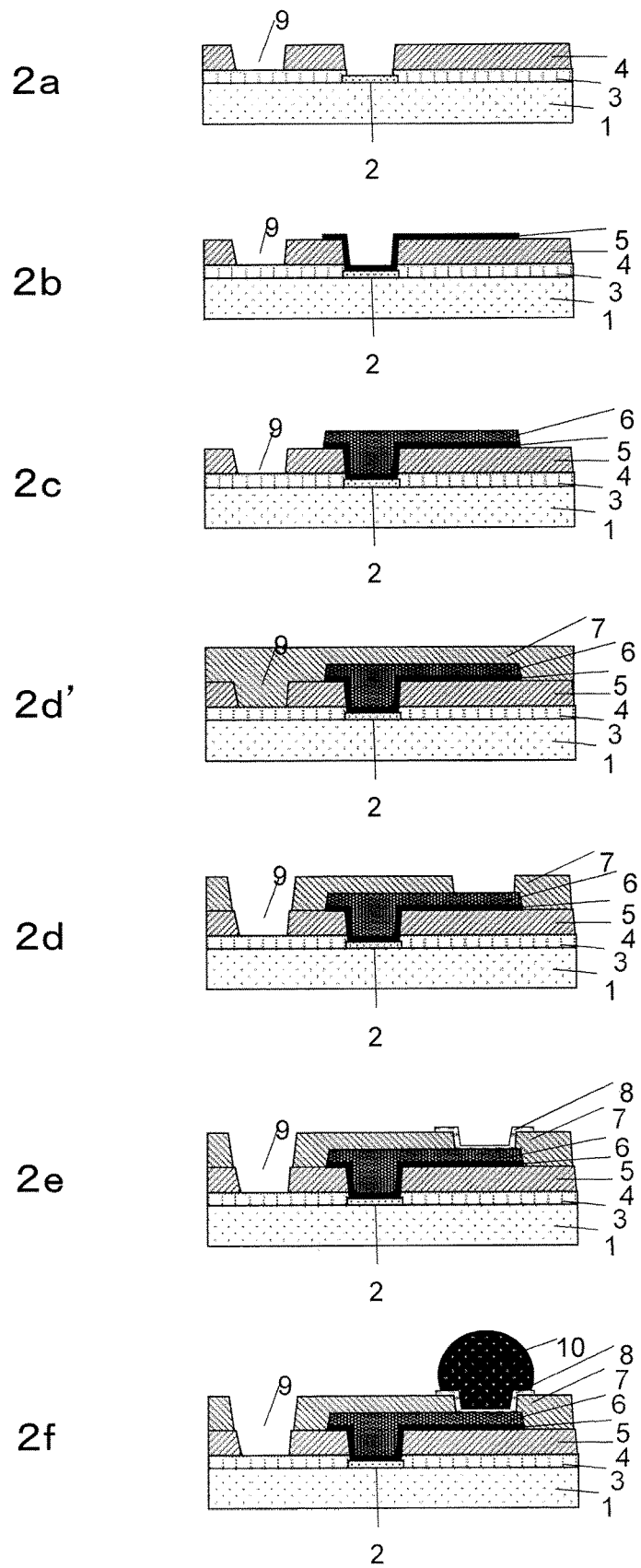
FIG. 2 depicts a detailed method of producing a semiconductor device having a bump.

Next, a method of manufacturing a semiconductor device will be described in detail in FIG. 2. As illustrated in 2a in FIG. 2, on a silicon wafer 1, an Al pad 2 for input/output and then a passivation film 3 are formed, and an insulating film 4 is then formed into a pattern that is made of a cured film formed by curing the photosensitive resin composition of the present invention. Subsequently, as illustrated in 2b in FIG. 2, a metal film (Cr, Ti, or the like) 5 is formed so as to be connected with the Al pad 2, and a metal line 6 is formed as illustrated in 2c in FIG. 2 by film deposition based on a plating method. Then, the photosensitive resin composition of the present invention before curing is applied as illustrated in 2d in FIG. 2 and an insulating film 7 as a pattern as shown in 2d in FIG. 2 is formed through a photolithography process. During this step, the photosensitive resin composition for the insulating film 7 before curing undergoes thick film processing at a scribe line 9. In case of forming a multilayer wiring structure comprising three or more layers, the above-described steps can be repeated to form each layer.

Subsequently, as illustrated in 2e and 2f in FIG. 2, a barrier metal 8 and a solder bump 10 are formed. Then, the structure is diced along the last scribe line 9 to separate individual chips. In cases where the insulating film 7 has no pattern along the scribe line 9 or residues are left there, cracks and the like are generated during dicing, which influence the reliability test of the chips. Because of this, the capability of providing a patterning process including an excellent thick film process, as in the present invention, is highly desirable for achieving high reliability in semiconductor devices.

EXAMPLES

The present invention will be described below by way of Examples, but the present invention is not limited thereto. First, evaluation procedures in the respective Examples and Comparative Examples will be described. A photosensitive resin composition before curing (hereinafter referred to as varnish) previously filtered through a polytetrafluoroethylene filter having a pore size of 1 μm (manufactured by Sumitomo Electric Industries, Ltd.) was used for evaluation.

(1) Measurement of Molecular Weight

The weight average molecular weight (Mw) of a resin containing the structural unit (A) was confirmed using the GPC (gel permeation chromatography) machine Waters 2690-996 (manufactured by Nihon Waters K.K.). Measurement was carried out using N-methyl-2-pyrrolidone (hereinafter referred to as NMP) as a developing solvent to calculate the weight average molecular weight (Mw) and the dispersity (PDI=Mw/Mn) in terms of polystyrene.

(2) Evaluation of Chemical Resistance

The varnish was applied onto a silicon wafer by a spincoating method using the coating/developing machine ACT-8 such that the varnish would have a film thickness of 10 μm after prebaking at 120° C. for three minutes, and was prebaked, followed by a heat treatment using the inert oven CLH-21CD-S, in which the temperature was increased to 220 to 320° C. at a temperature rising rate of 3.5° C./min and then held constant at 220 to 320° C. for one hour at an oxygen concentration of not higher than 20 ppm under nitrogen gas flow. When the temperature has reached not more than 50° C., the silicon wafer was taken out, and the cured film was dipped in an organic chemical liquid (dimethylsulfoxide to a 25% tetramethylammonium hydroxide aqueous solution at 92:2) at 65° C. for 60 minutes and then observed to see whether there was any peeling or elution of the pattern. The results were rated 2, or good, in cases where there was no peeling nor elution on the pattern, and 1, or poor, in cases where any peeling and/or any elution was/were observed on the pattern.

(3) Evaluation of High Elongation Property (Elongation at Break)

The varnish was applied onto an eight-inch silicon wafer by a spincoating method using the coating/developing machine ACT-8 such that the varnish would have a film thickness of 11 μm after prebaking at 120° C. for three minutes, and was prebaked, followed by a heat treatment using the inert oven CLH-21CD-S (manufactured by Koyo Thermo Systems Co., Ltd.), in which the temperature was increased to 220° C. at a temperature rising rate of 3.5° C./min and then held constant at 220° C. for one hour at an oxygen concentration of not higher than 20 ppm. Upon reaching a temperature of not higher than 50° C., the silicon wafer was taken out and dipped in 45% by mass hydrofluoric acid for five minutes to peel off a cured resin composition film from the wafer. This film was cut into 1 cm wide and 9 cm long strips and measured for elongation at break using the Tensilon RTM-100 (manufactured by Orientec Co., Ltd.) by pulling the strips at a traction speed of 50 mm/min and at a room temperature of 23.0° C. and a humidity of 45.0% RH. Ten strips per specimen were measured to determine the average value of the top five results. A cured film having an elongation at break of 60% or more was evaluated as very good and scored as 4, a cured film having an elongation at break of 20% or more and less than 60% was evaluated as good and scored as 3, a cured film having an elongation at break of 10% or more and less than 20% was evaluated as acceptable and scored as 2, and a cured film having an elongation at break of less than 10% was evaluated as poor and scored as 1.

(4) Evaluation of Adhesion

The adhesion to metal copper was evaluated by the following procedures. First, the varnish was applied onto a copper-plated substrate having a thickness of about 3 μm by a spincoating method using a spinner (manufactured by Mikasa Co., Ltd.) and then baked on a hot plate (D-SPIN; manufactured by Dainippon Screen Manufacturing Co., Ltd.) at 120° C. for three minutes by using the hot plate, and a prebaked film having a thickness of 8 μm was finally produced. A heat treatment on this film was carried out using the inert oven CLH-21CD-S (manufactured by Koyo Thermo Systems Co., Ltd.), in which the temperature was increased to 220 to 320° C. at a temperature rising rate of 3.5° C./min and then held constant at 220 to 320° C. for one hour at an oxygen concentration of not higher than 20 ppm. Upon reaching a temperature of not higher than 50° C., the substrate was taken out and divided into two pieces, and incisions were made 2 mm apart to produce a grid of 10 columns and 10 rows in each substrate piece by using a single edged knife on the cured film. One of those sample substrates was used to count the number of peeled cells out of 100 which were tried to be peeled off using "Cello-tape (registered trademark)" and thereby to evaluate the adhesion property between the metal material and the cured resin film. A pressure cooker test (PCT) machine (HAST CHAMBER EHS-211MD; manufactured by Tabai Espec Co.) was used to treat the other sample substrate for PCT for 400 hours under the saturation conditions at 121° C. and 2 atmospheres, and then the above-described peeling-off test was performed. For either substrate in the peeling-off tests, a case of no peeled cell was evaluated as very good and scored as 4, a case of 1 or more and less than 20 peeled cells was evaluated as good and scored as 3, a case of 20 or more and less than 50 peeled cells was evaluated as acceptable and scored as 2, and a case of 50 or more peeled cells was evaluated as poor and scored as 1.

(5) Calculation of the Ring Closure Rate of a Cured Film

The obtained cured film (A) was heated in the range of 300 to 350° C. to obtain a cured film (B). The infrared absorption spectra of the cured film (A) and cured film (B) were measured to determine the absorbance at a peak at about 1050 cm$^{-1}$ due to C—O stretch vibration. In the measurement of the infrared absorption spectra, "FT-720" (trade name, manufactured by Horiba, Ltd.) was used as a measuring device. The ring closure rate of the cured film (A) was calculated from the following formula, where the ring closure rate of the cured film (B) was set to 100%. The ring closure rate as used herein refers to the ring closure rate of a polybenzoxazole precursor structural unit. In the present examples, a cured film was produced from the varnish and the ring closure rate thereof was calculated. For the calculation of a ring closure rate in the present examples, the varnish was applied onto a silicon wafer by spincoating and then dried at 120° C. for three minutes to obtain a coated film having a film thickness of 5 μm. This coated film was further heated either at 220° C. for 10 minutes or at 320° C. for 10 minutes to obtain cured films (a cured film (A) heated at 220° C. and a cured film (B) heated at 320° C.). The cured film (A) and cured film (B) were used to calculate the ring closure rate of the cured film (A) at 220° C. from the following formula. The heating temperature for the cured film (A) is the curing temperature of the cured film. The heating temperature for the cured film (B), that is, 320° C. is the temperature at which the component (A) in a cured film is completely cured (a curing rate of 100% is achieved). The thermal decomposition temperature of a cured film can be analyzed by thermal gravimetric analysis (TGA).

$$\text{Ring Closure Rate of Cured Film }(A) = \frac{\{\text{Absorbance of Cured Film }(A)\}}{\{\text{Absorbance of Cured Film }(B)\}} \times 100\ (\%)$$

(6) Reliability Test

A reliability test was performed by the following procedures.

(6)-1. Evaluation of Mechanical Properties After High-Temperature Storage (HTS)

The varnish was applied onto an eight-inch silicon wafer by a spincoating method using the coating/developing machine ACT-8 such that the varnish would have a film thickness of 11 μm after prebaking at 120° C. for three minutes, and the varnish was prebaked, followed by a heat treatment using the inert oven CLH-21CD-S (manufactured by Koyo Thermo Systems Co., Ltd.), in which the temperature was increased to 220° C. at a temperature rising rate of 3.5° C./min and then held constant at 220° C. for one hour at an oxygen concentration of not higher than 20 ppm. Upon reaching a temperature of not higher than 50° C., the wafer was taken out and then treated at 150° C. for 500 hours by using a high-temperature storage testing device. The wafer was taken out and dipped in 45% by mass hydrofluoric acid for five minutes to peel off a resin composition film from the wafer. This film was cut into 1 cm wide and 9 cm long strips and measured for elongation at break using the Tensilon RTM-100 (manufactured by Orientec Co., Ltd.) by pulling the strips at a traction speed of 5 mm/min and at a room temperature of 23.0° C. and a humidity of 45.0% RH. Ten strips per specimen were measured to determine the average value of the top five results. A cured film having an elongation at break of 60% or more was evaluated as very good and scored as 4, a cured film having an elongation at break of 20% or more and less than 60% was evaluated as good and scored as 3, a cured film having an elongation at break of 10% or more and less than 20% was evaluated as acceptable and scored as 2, and a cured film having an elongation at break of less than 10% was evaluated as poor and scored as 1.

(6)-2. Evaluation of Adhesion After High-Temperature Storage (HTS)

The varnish was applied onto a copper-plated substrate having a thickness of about 3 μm by a spincoating method using a spinner (manufactured by Mikasa Co., Ltd.) and then baked on a hot plate (D-SPIN; manufactured by Dainippon Screen Manufacturing Co., Ltd.) at 120° C. for three minutes by using the hot plate, and a prebaked film having a thickness of 8 μm was finally produced. A heat treatment on this film was carried out using the inert oven CLH-21CD-S (manufactured by Koyo Thermo Systems Co., Ltd.), in which the temperature was increased to 220° C. at a temperature rising rate of 3.5° C./min and then held constant at 220° C. for one hour at an oxygen concentration of not higher than 20 ppm. Upon reaching a temperature of not higher than 50° C., the substrate was taken out and incisions were made 2 mm apart to produce a grid of 10 columns and 10 rows by using a single edged knife on the cured film. A heat treatment on this sample substrate was carried out at 150° C. for 500 hours by using the high-temperature storage testing device, and then the above-described peeling-off test was performed. For any substrate in the peeling-off test, a case of no peeled cell was evaluated as very good and scored as 4, a case of 1 or more and less than 20 peeled cells was evaluated as good and scored as 3, a case of 20 or more and less than 50 peeled cells was evaluated as acceptable and scored as 2, and a case of 50 or more peeled cells was evaluated as poor and scored as 1.

Synthesis Example 1

Synthesis of an Alkaline-Solution-Soluble Polyamide Resin (A-1)

Under dry nitrogen gas flow, 2,2-bis(3-amino-4-hydroxyphenyl)hexafluoropropane (hereinafter referred to as BAHF) (27.47 g, 0.075 moles) was dissolved in 257 g of NMP. To this, 1,1'-(4,4'-oxybenzoyl)diimidazole (hereinafter referred to as PBOM) (17.20 g, 0.048 moles) was added along with 20 g of NMP, and the resulting mixture was allowed to react at 85° C. for three hours. Subsequently, RT-1000 containing propyleneoxide and tetramethylene ether glycol structures (20.00 g, 0.020 moles), 1,3-bis(3-aminopropyl)tetramethyldisiloxane (1.24 g, 0.0050 moles), and PBOM (14.33 g, 0.044 moles) were added thereto along with 50 g of NMP, and the resulting mixture was allowed to react at 85° C. for one hour. Furthermore, 5-norbornene-2,3-dicarboxylic acid anhydride (3.94 g, 0.024 moles) as an end-capping agent was added thereto along with 10 g of NMP, and the resulting mixture was allowed to react at 85° C. for 30 minutes. After completion of the reaction, the reaction mixture was cooled down to room temperature, and acetic acid (52.82 g, 0.88 moles) was added thereto along with 87 g of NMP and stirred at room temperature for one hour. After the stirring was finished, the solution was poured into 3 L of water to afford a white precipitate. This precipitate was collected by filtration, washed three times with water, and then dried in a forced-air drier at 50° C. for 3 days to afford an alkali-soluble polyamide resin (A-1) in powder form. The results of the evaluation by the above-described methods indicated that the weight average molecular weight of the resin (A-1) was 40,000 and the PDI was 2.2.

Synthesis Example 2

Synthesis of an Alkali-Soluble Polyamide Resin (A-2)

Under dry nitrogen gas flow, BAHF (29.30 g, 0.080 moles) and RT-1000 containing propyleneoxide and tetramethylene ether glycol structures (20.00 g, 0.020 moles) were dissolved in 205 g of NMP. PBOM (28.67 g, 0.080 moles) was added thereto along with 20 g of NMP, and the resulting mixture was allowed to react at 85° C. for three hours. Subsequently, 2,2'-bis[N-(3-aminobenzoyl)-3-amino-4-hydroxyphenyl]hexafluoropropane (hereinafter referred to as HFHA) (0.60 g, 0.0010 moles) and 1,3-bis(3-aminopropyl) tetramethyldisiloxane (1.49 g, 0.0060 moles) were added thereto along with 20 g of NMP, and the resulting mixture was allowed to react at 85° C. for 30 minutes. Subsequently, 5-norbornene-2,3-dicarboxylic acid anhydride (6.57 g, 0.040 moles) as an end-capping agent was added thereto along with 10 g of NMP, and the resulting mixture was allowed to react at 85° C. for 30 minutes. Furthermore, 4,4'-oxydiphthalic acid anhydride (hereinafter referred to as ODPA) (2.17 g, 0.0070 moles) was added thereto along with 30 g of NMP, and the resulting mixture was allowed to react at 85° C. for one hour. After completion of the reaction, the reaction mixture was cooled down to room temperature, and acetic acid (48.02 g, 0.80 moles) was added thereto along with 67 g of NMP and stirred at room temperature for one hour. After the stirring was finished, the solution was poured into 3 L of water to afford a white precipitate. This precipitate was collected by filtration, washed three times with water, and then dried in a forced-air drier at 50° C. for 3 days to afford an alkali-soluble polyamide resin (A-2) in powder form. The results of the evaluation by the above-described methods indicated that the weight average molecular weight of the resin (A-2) was 31,600 and the PDI was 1.9.

Synthesis Example 3

Synthesis of an Alkali-Soluble Polyamide Resin (A-3)

According to the above Synthesis Example 2, BAHF (32.96 g, 0.090 moles), PBOM (29.38 g, 0.082 moles), RT-1000 (10.00 g, 0.010 moles), 1,3-bis(3-aminopropyl) tetramethyldisiloxane (1.49 g, 0.0060 moles), 5-norbornene-2,3-dicarboxylic acid anhydride (5.91 g, 0.036 moles), HFHA (0.60 g, 0.0010 moles), ODPA (2.17 g, 0.0070 moles), acetic acid (49.22 g, 0.82 moles), and 360 g of NMP were used similarly to obtain an alkali-soluble polyamide resin (A-3) in powder form. The results of the evaluation by the above-described methods indicated that the weight average molecular weight of the resin (A-3) was 30,200 and the PDI was 2.2.

Synthesis Example 4

Synthesis of an Alkali-Soluble Polyamide Resin (A-4)

According to the above Synthesis Example 1, BAHF (27.47 g, 0.075 moles), PBOM (30.10 g, 0.084 moles), ED-900 having a propyleneoxide structure and an ethylene glycol structure (9.00 g, 0.020 moles), 1,3-bis(3-aminopropyl)tetramethyldisiloxane (1.24 g, 0.0050 moles), 5-norbornene-2,3-dicarboxylic acid anhydride (5.25 g, 0.032 moles), acetic acid (48.02 g, 0.80 moles), and 409 g of NMP were used similarly to obtain an alkali-soluble polyamide resin (A-4) in powder form. The results of the evaluation by the above-described methods indicated that the weight average molecular weight of the resin (A-4) was 34,500 and the PDI was 2.1.

Synthesis Example 5

Synthesis of an Alkali-Soluble Polyamide Resin (A-5)

According to the above Synthesis Example 2, BAHF (29.30 g, 0.080 moles), PBOM (30.10 g, 0.084 moles), ED-900 (18.00 g, 0.020 moles), 1,3-bis(3-aminopropyl) tetramethyldisiloxane (1.49 g, 0.0060 moles), 5-norbornene-2,3-dicarboxylic acid anhydride (5.25 g, 0.032 moles), HFHA (0.60 g, 0.0010 moles), ODPA (2.17 g, 0.0070 moles), acetic acid (50.42 g, 0.84 moles), and 340 g of NMP were used similarly to obtain an alkali-soluble polyamide resin (A-5) in powder form. The results of the evaluation by the above-described methods indicated that the weight average molecular weight of the resin (A-5) was 33,200 and the PDI was 2.0.

Synthesis Example 6

Synthesis of an Alkali-Soluble Polyamide Resin (A-6)

According to the above Synthesis Example 2, BAHF (32.96 g, 0.090 moles), PBOM (30.10 g, 0.084 moles), ED-900 (9.00 g, 0.010 moles), 1,3-bis(3-aminopropyl)tetramethyldisiloxane (1.49 g, 0.0060 moles), 5-norbornene-2,3-dicarboxylic acid anhydride (5.25 g, 0.032 moles), HFHA (0.60 g, 0.0010 moles), ODPA (2.17 g, 0.0070 moles), acetic acid (50.42 g, 0.84 moles), and 360 g of NMP were used similarly to obtain an alkali-soluble polyamide resin (A-6) in powder form. The results of the evaluation by the above-described methods indicated that the weight average molecular weight of the resin (A-6) was 32,200 and the PDI was 2.2.

Synthesis Example 7

Synthesis of an Alkali-Soluble Polyamide Resin (A-7)

According to the above Synthesis Example 1, BAHF (34.79 g, 0.095 moles), PBOM (31.53 g, 0.088 moles), 1,3-bis(3-aminopropyl)tetramethyldisiloxane (1.24 g, 0.0050 moles), 5-norbornene-2,3-dicarboxylic acid anhydride (3.94 g, 0.024 moles), acetic acid (52.82 g, 0.50 moles), and 352 g of NMP were used similarly to obtain an alkali-soluble polyamide resin (A-7) in powder form. The results of the evaluation by the above-described methods indicated that the weight average molecular weight of the resin (A-7) was 35,800 and the PDI was 2.5.

Synthesis Example 8

Synthesis of a poly(o-hydroxyamide) (A-8)

Under dry nitrogen gas flow, 100 g of N-methylpyrrolidone was placed and 2,2-bis(3-amino-4-hydroxyphenyl) hexafluoropropane (32.96 g, 0.090 moles) and m-aminophenol (2.18 g, 0.020 moles) were added thereto, and the resulting mixture was stirred and dissolved at room temperature. Subsequently, dodecanedioic acid dichloride (20.04 g, 0.075 moles) was added dropwise over 10 minutes to the reaction solution while maintaining the temperature in the range of −10 to 0° C., and then diphenylether 4,4'-dicarboxylic acid chloride (7.38 g, 0.025 moles) was added, and the resulting mixture was stirred at room temperature for three hours. The reaction solution was poured into 3 L of water, and the resulting precipitate was collected and washed three times with pure water, and then dried in a forced-air drier at 50° C. for 3 days to afford a poly(o-hydroxyamide) (A-8) in powder form. The results of the evaluation by the above-described methods indicated that the weight average molecular weight of the resin (A-8) was 31,000 and the PDI was 2.3.

Synthesis Example 9

Synthesis of an Alkali-Soluble Polyamide Resin (A-9)

According to the above Synthesis Example 2, BAHF (32.96 g, 0.090 moles), PBOM (29.38 g, 0.082 moles), HT-1100 (11.00 g, 0.010 moles), 1,3-bis(3-aminopropyl)tetramethyldisiloxane (1.49 g, 0.0060 moles), 5-norbornene-2,3-dicarboxylic acid anhydride (5.91 g, 0.036 moles), HFHA (0.60 g, 0.0010 moles), ODPA (2.17 g, 0.0070 moles), acetic acid (49.22 g, 0.50 moles), and 360 g of NMP were used similarly to obtain an alkali-soluble polyamide resin (A-9) in powder form. The results of the evaluation by the above-described methods indicated that the weight average molecular weight of the resin (A-9) was 31,200 and the PDI was 2.3.

Synthesis Example 10

Synthesis of an Alkali-Soluble Polyamide Resin (A-10)

According to the above Synthesis Example 2, BAHF (32.96 g, 0.090 moles), PBOM (29.38 g, 0.082 moles), HT-1700 (17.00 g, 0.010 moles), 1,3-bis(3-aminopropyl)tetramethyldisiloxane (1.49 g, 0.0060 moles), 5-norbornene-2,3-dicarboxylic acid anhydride (5.91 g, 0.036 moles), HFHA (0.60 g, 0.0010 moles), ODPA (2.17 g, 0.0070 moles), acetic acid (49.22 g, 0.50 moles), and 360 g of NMP were used similarly to obtain an alkali-soluble polyamide resin (A-10) in powder form. The results of the evaluation by the above-described methods indicated that the weight average molecular weight of the resin (A-10) was 32,100 and the PDI was 2.4.

Synthesis Example 11

Synthesis of a Cyclized Polyimide Resin (A-11)

Under dry nitrogen gas flow, BAHF (11.9 g, 0.0325 moles), RT-1000 (15.0 g, 0.015 moles), 1,3-bis(3-aminopropyl)tetramethyldisiloxane (0.62 g, 0.0025 moles), and 5-norbornene-2,3-dicarboxylic acid (0.82 g, 0.005 moles) were dissolved in 125 g of NMP. To this, 4,4'-oxydiphthalic acid anhydride (13.95 g, 0.045 moles) was added along with 25 g of NMP, and the resulting mixture was stirred at 60° C. for one hour and then at 180° C. for four hours. After the stirring was finished, the solution was poured into 3 L of water to afford a white precipitate. This precipitate was collected by filtration, washed three times with water, and then dried in a forced-air drier at 50° C. for 3 days to afford a cyclized polyimide resin (A-11) in powder form. The imidation rate of the obtained resin was 97%. The results of the evaluation by the above-described methods indicated that the weight average molecular weight of the resin (A-11) was 38,800 and the PDI was 1.9.

Synthesis Example 12

Synthesis of an Alkali-Soluble Polyamide Resin (A-12)

Under nitrogen gas flow, 27.2 g (0.4 moles) of imidazole was poured into a 250 ml three-necked flask and dissolved in 100 g of NMP with stirring at room temperature. With this held at −10 to 0° C., a solution of dodecanedioic acid dichloride (26.72 g, 0.1 mole) dissolved in 100 g of NMP was added dropwise over one hour while the temperature of the reaction solution was controlled so as not to exceed 0° C. After the dropwise addition, the reaction solution was stirred at room temperature for additional three hours, poured into 1 L of pure water, and filtrated to obtain a precipitate. The precipitate obtained by filtration was washed with pure water several times, and dried in a vacuum oven at 50° C. for 100 hours to obtain an acid A represented by the below-mentioned formula.

Subsequently, according to the above Synthesis Example 2, BAHF (32.96 g, 0.090 moles), PBOM (7.17 g, 0.020 moles), the acid A (20.49 g, 0.062 moles), RT-1000 (10.00 g, 0.010 moles), 1,3-bis(3-aminopropyl)tetramethyldisiloxane (1.49 g, 0.0060 moles), 5-norbornene-2,3-dicarboxylic acid anhydride (5.91 g, 0.036 moles), HFHA (0.60 g, 0.0010 moles), ODPA (2.17 g, 0.0070 moles), acetic acid (49.22 g, 0.82 moles), and 360 g of NMP were used similarly to obtain an alkali-soluble polyamide resin (A-12) in powder form. The results of the evaluation by the above-described methods indicated that the weight average molecular weight of the resin (A-12) was 31,200 and the PDI was 2.3.

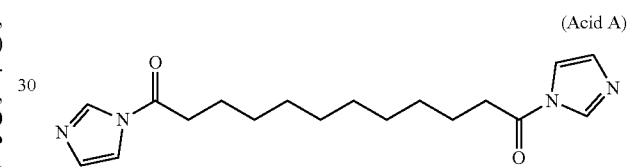

(Acid A)

Synthesis Example 13

Synthesis of an Alkali-Soluble Polyamide Resin (A-13)

According to the above Synthesis Example 12, BAHF (32.96 g, 0.090 moles), PBOM (14.69 g, 0.041 moles), the acid A (13.55 g, 0.041 moles), RT-1000 (10.00 g, 0.010 moles), 1,3-bis(3-aminopropyl)tetramethyldisiloxane (1.49 g, 0.0060 moles), 5-norbornene-2,3-dicarboxylic acid anhydride (5.91 g, 0.036 moles), HFHA (0.60 g, 0.0010 moles), ODPA (2.17 g, 0.0070 moles), acetic acid (49.22 g, 0.82 moles), and 360 g of NMP were used similarly to obtain an alkali-soluble polyamide resin (A-13) in powder form. The results of the evaluation by the above-described methods indicated that the weight average molecular weight of the resin (A-13) was 30,800 and the PDI was 2.3.

Synthesis Example 14

Synthesis of an Alkali-Soluble Polyamide Resin (A-14)

Under nitrogen gas flow, 27.2 g (0.4 moles) of imidazole was poured into a 250 ml three-necked flask and stirred to be dissolved in 100 g of NMP at room temperature. With the reaction solution held at −10 to 0° C., a solution of sebacic dichloride (23.91 g, 0.1 mole) dissolved in 100 g of NMP was added dropwise over one hour while the temperature of the reaction solution was controlled so as not to exceed 0° C. After the dropwise addition, the reaction solution was stirred at room temperature for additional three hours, poured into 1 L of pure water, and filtrated to obtain the precipitate. The precipitate obtained by filtration was washed with pure water several times, and dried in a vacuum oven at 50° C. for 100 hours to obtain an acid B represented by the below-mentioned formula.

Subsequently, according to the above Synthesis Example 2, BAHF (32.96 g, 0.090 moles), PBOM (7.17 g, 0.020 moles), the acid B (18.75 g, 0.062 moles), RT-1000 (10.00 g, 0.010 moles), 1,3-bis(3-aminopropyl)tetramethyldisiloxane (1.49 g, 0.0060 moles), 5-norbornene-2,3-dicarboxylic acid anhydride (5.91 g, 0.036 moles), HFHA (0.60 g, 0.0010 moles), ODPA (2.17 g, 0.0070 moles), acetic acid (49.22 g, 0.82 moles), and 360 g of NMP were used similarly to obtain an alkali-soluble polyamide resin (A-14) in powder form. The results of the evaluation by the above-described methods indicated that the weight average molecular weight of the resin (A-14) was 29,200 and the PDI was 2.3.

Examples 1 to 19, Comparative Examples 1 to 10

To 10 g each of the obtained resins (A-1 to A-10 and A-12), 2.0 g of a photo acid generator represented as the component (B) by the following formula and 1.0 g of HMOM-TPHAP (C1) and 0.5 g of MW-100LM (C2) as the components (C) were added, and then 20 g of γ-butyrolactone as a solvent was added thereto to produce varnishes, and their properties were determined by the above-described evaluation methods. The obtained results are shown in Table 1.

Examples 20 to 33, Comparative Examples 11 to 13

To 10 g each of the obtained resins (A-3, A-8, A-10, and A-11 to A-14), 2.0 g of a photo acid generator represented as the component (B) by the following formula, 0.5 g of HMOM-TPHAP (C1) and 0.5 g of MW-100LM (C2) as the components (C) were added, and then 20 g of γ-butyrolactone as a solvent was added thereto to produce varnishes, and components (D-1), (D-2), (E-1), (E-2) and (F) represented by the following formulae were further added singly thereto according to the indicated parts by mass in Table 2 to produce the varnishes, and their properties were determined by the above-described evaluation methods. The obtained results are shown in Table 2.

(Acid B)

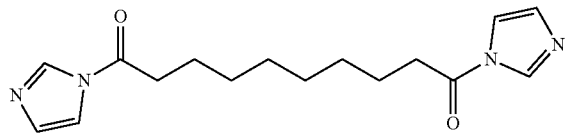

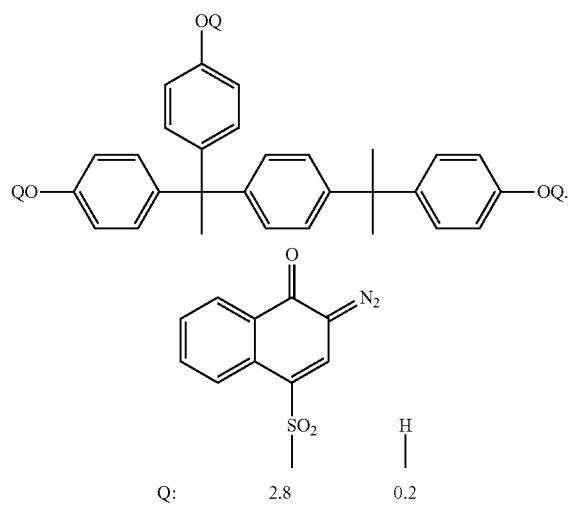

Q: 2.8     0.2

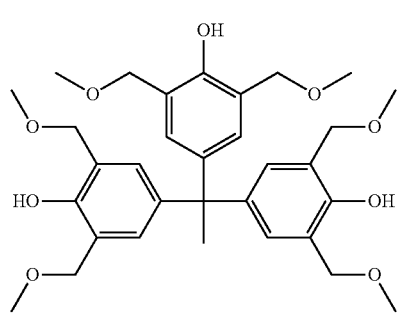
(C1)

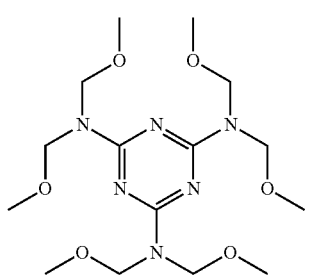
(C2)

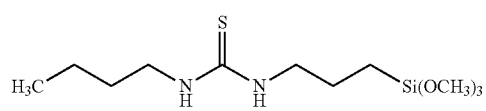
(D-1)

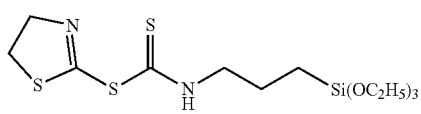
(D-2)

-continued

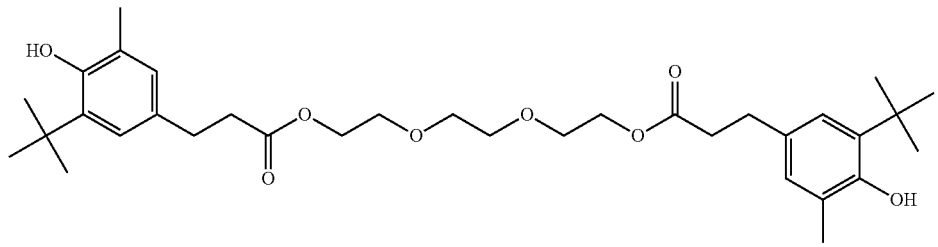

(E-1)

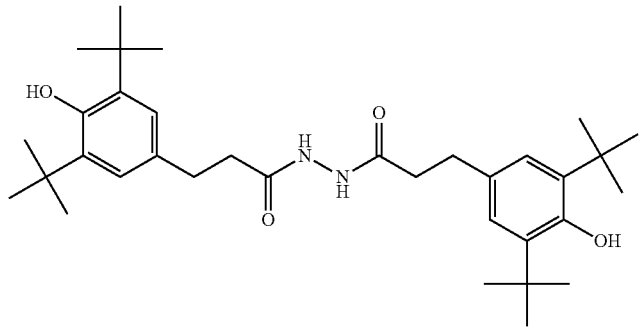

(E-2)

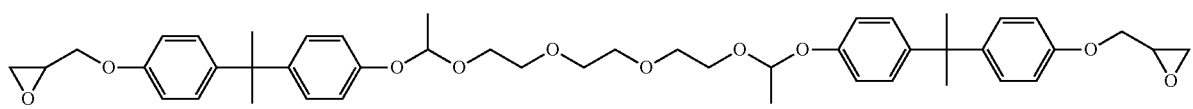

(F)

TABLE 1

| | Resin of Component (A) | Heat-crosslinker (C) | Curing Temperature (° C.) | Ring Closure Rate (%) | Chemical Resistance | Elongation at Break (%) | | Evaluation of Adhesion Before PCT Test Judgement | After PCT Test Judgement |
|---|---|---|---|---|---|---|---|---|---|
| Example 1 | A-1 | C1 (1.0)/C2 (0.5) | 220 | 21 | 2 | 82 | 4 | 4 | 4 |
| Example 2 | | C1 (1.0)/C2 (0.5) | 250 | 54 | 2 | 71 | 4 | 4 | 4 |
| Example 3 | A-2 | C1 (1.0)/C2 (0.5) | 220 | 19 | 2 | 79 | 4 | 4 | 4 |
| Example 4 | | C1 (1.0)/C2 (0.5) | 250 | 54 | 2 | 69 | 4 | 4 | 4 |
| Example 5 | A-3 | C1 (1.0)/C2 (0.5) | 220 | 18 | 2 | 74 | 4 | 4 | 4 |
| Example 6 | | C1 (1.0)/C2 (0.5) | 250 | 51 | 2 | 61 | 4 | 4 | 4 |
| Example 7 | A-4 | C1 (1.0)/C2 (0.5) | 220 | 12 | 2 | 83 | 4 | 4 | 4 |
| Example 8 | | C1 (1.0)/C2 (0.5) | 250 | 55 | 2 | 75 | 4 | 4 | 4 |
| Example 9 | A-5 | C1 (1.0)/C2 (0.5) | 220 | 13 | 2 | 77 | 4 | 4 | 4 |
| Example 10 | | C1 (1.0)/C2 (0.5) | 250 | 48 | 2 | 70 | 4 | 4 | 4 |
| Example 11 | A-6 | C1 (1.0)/C2 (0.5) | 220 | 13 | 2 | 71 | 4 | 4 | 4 |
| Example 12 | | C1 (1.0)/C2 (0.5) | 250 | 47 | 2 | 63 | 4 | 4 | 4 |
| Example 13 | A-7 | C1 (1.0)/C2 (0.5) | 250 | 32 | 2 | 42 | 3 | 4 | 4 |
| Example 14 | A-9 | C1 (1.0)/C2 (0.5) | 220 | 14 | 2 | 79 | 4 | 4 | 4 |
| Example 15 | | C1 (1.0)/C2 (0.5) | 250 | 49 | 2 | 64 | 4 | 4 | 4 |
| Example 16 | A-10 | C1 (1.0)/C2 (0.5) | 220 | 15 | 2 | 81 | 4 | 4 | 4 |
| Example 17 | | C1 (1.0)/C2 (0.5) | 250 | 45 | 2 | 66 | 4 | 4 | 4 |
| Example 18 | A-12 | C1 (1.0)/C2 (0.5) | 180 | 31 | 2 | 91 | 4 | 4 | 4 |
| Example 19 | | C1 (1.0)/C2 (0.5) | 200 | 54 | 2 | 74 | 4 | 4 | 4 |
| Comparative Example 1 | A-1 | C1 (1.0)/C2 (0.5) | 200 | 6 | 1 | 84 | 4 | 4 | 3 |
| Comparative Example 2 | | C1 (1.0)/C2 (0.5) | 280 | 88 | 2 | 65 | 4 | 3 | 1 |
| Comparative Example 3 | A-2 | C1 (1.0)/C2 (0.5) | 200 | 5 | 1 | 82 | 4 | 4 | 3 |
| Comparative Example 4 | | C1 (1.0)/C2 (0.5) | 280 | 90 | 2 | 61 | 4 | 3 | 2 |
| Comparative Example 5 | A-3 | C1 (1.0)/C2 (0.5) | 200 | 3 | 1 | 80 | 4 | 4 | 3 |
| Comparative Example 6 | | C1 (1.0)/C2 (0.5) | 280 | 77 | 2 | 55 | 3 | 3 | 1 |

TABLE 1-continued

| | Resin of Component (A) | Heat-crosslinker (C) | Ring Curing Temperature (° C.) | Ring Closure Rate (%) | Chemical Resistance | Elongation at Break (%) | | Evaluation of Adhesion Before PCT Test Judgement | Evaluation of Adhesion After PCT Test Judgement |
|---|---|---|---|---|---|---|---|---|---|
| Comparative Example 7 | A-7 | C1 (1.0)/C2 (0.5) | 200 | 2 | 1 | 35 | 3 | 4 | 2 |
| Comparative Example 8 | | C1 (1.0)/C2 (0.5) | 320 | 100 | 2 | 44 | 3 | 1 | — |
| Comparative Example 9 | A-8 | C1 (1.0)/C2 (0.5) | 220 | 100 | 2 | 80 | 4 | 1 | — |
| Comparative Example 10 | A-10 | C1 (1.0)/C2 (0.5) | 220 | — | 2 | 15 | 2 | 4 | — |

The values in the parentheses for the heat-crosslinkers (C) indicate the contents (parts by mass) relative to 100 parts by mass of a resin based on the component (A).

TABLE 2

| | Resin of Component (A) | Added Amounts of Components (D), (E), and (F) Component (D) parts by mass | Added Amounts of Components (D), (E), and (F) Component (E) parts by mass | Added Amounts of Components (D), (E), and (F) Component (F) parts by mass | Curing Temperature (° C.) | Ring Closure Rate (%) | Chemical Resistance |
|---|---|---|---|---|---|---|---|
| Example 20 | A-3 | — | — | — | 220 | 18 | 2 |
| Example 21 | A-10 | — | — | — | 220 | 20 | 2 |
| Example 22 | A-3 | (D-1) 0.15 g | — | — | 220 | 19 | 2 |
| Example 23 | A-3 | (D-2) 0.15 g | — | — | 220 | 17 | 2 |
| Example 24 | A-3 | — | (E-1) 0.15 g | — | 220 | 17 | 2 |
| Example 25 | A-3 | — | (E-2) 0.15 g | — | 220 | 17 | 2 |
| Example 26 | A-3 | (D-2) 0.15 g | (E-2) 0.15 g | — | 220 | 18 | 2 |
| Example 27 | A-3 | (D-2) 0.15 g | (E-1) 0.15 g | Component (F) 1.5 g | 220 | 18 | 2 |
| Example 28 | A-3 | (D-2) 0.15 g | (E-1) 0.15 g | Component (F) 0.18 g | 220 | 19 | 2 |
| Example 29 | A-3 | (D-2) 0.15 g | (E-1) 0.15 g | Component (F) 2.0 g | 220 | 18 | 2 |
| Example 30 | A-12 | (D-2) 0.15 9 | (E-1) 0.15 g | Component (F) 1.5 g | 180 | 35 | 2 |
| Example 31 | A-12 | (D-2) 0.15 g | (E-1) 0.15 g | Component (F) 1.5 g | 200 | 53 | 2 |
| Example 32 | A-13 | (D-2) 0.15 g | (E-1) 0.15 g | Component (F) 1.5 g | 220 | 48 | 2 |
| Example 33 | A-14 | (D-2) 0.15 g | (E-1) 0.15 g | Component (F) 1.5 g | 200 | 54 | 2 |
| Comparative Example 11 | A-8 | — | — | — | 220 | 100 | 2 |
| Comparative Example 12 | A-8 | (D-2) 0.15 g | (E-1) 0.15 g | Component (F) 1.5 g | 220 | 100 | 2 |
| Comparative Example 13 | A-11 | — | — | — | 220 | — | 2 |

| | Elongation at Break % | Elongation at Break Judgement | Elongation at Break after HTS % | Elongation at Break after HTS Judgement | Evaluation of Adhesion Before PCT Test or Before HTS Test | Evaluation of Adhesion After PCT Test | Evaluation of Adhesion After HTS Test |
|---|---|---|---|---|---|---|---|
| Example 20 | 74 | 4 | 38 | 3 | 4 | 4 | 2 |
| Example 21 | 78 | 4 | 43 | 3 | 4 | 4 | 2 |
| Example 22 | 73 | 4 | 37 | 3 | 4 | 4 | 3 |
| Example 23 | 73 | 4 | 38 | 3 | 4 | 4 | 3 |
| Example 24 | 72 | 4 | 46 | 3 | 4 | 4 | 3 |
| Example 25 | 71 | 4 | 56 | 3 | 4 | 4 | 3 |
| Example 26 | 73 | 4 | 56 | 3 | 4 | 4 | 4 |
| Example 27 | 70 | 4 | 61 | 4 | 4 | 4 | 4 |
| Example 28 | 70 | 4 | 46 | 3 | 4 | 4 | 4 |
| Example 29 | 71 | 4 | 54 | 4 | 4 | 4 | 4 |
| Example 30 | 85 | 4 | 65 | 4 | 4 | 4 | 4 |
| Example 31 | 80 | 4 | 69 | 4 | 4 | 4 | 4 |
| Example 32 | 74 | 4 | 61 | 4 | 4 | 4 | 4 |

TABLE 2-continued

| | | | | | | | |
|---|---|---|---|---|---|---|---|
| Example 33 | 81 | 4 | 66 | 4 | 4 | 4 | 4 |
| Comparative Example 11 | 80 | 4 | 29 | 3 | 1 | — | — |
| Comparative Example 12 | 78 | 4 | 51 | 4 | 1 | — | — |
| Comparative Example 13 | 15 | 2 | 3 | 1 | 4 | 4 | 2 |

REFERENCE SIGNS LIST

1: silicon wafer
2: Al pad
3: passivation film
4: insulating film
5: metal film (Cr, Ti, or the like)
6: metal line (Al, Cu, or the like)
7: insulating film
8: barrier metal
9: scribe line
10: solder bump

The invention claimed is:

1. A cured film formed by curing a photosensitive resin composition containing a polybenzoxazole precursor (A),
wherein the polybenzoxazole precursor (A) comprises a structural unit represented by the general formula (1);
wherein the polybenzoxazole precursor (A) comprises a polyether structural unit represented by the general formula (2); and
wherein a rate at which the polybenzoxazole precursor (A) is cyclized into polybenzoxazole is not less than 10% and not more than 60%:

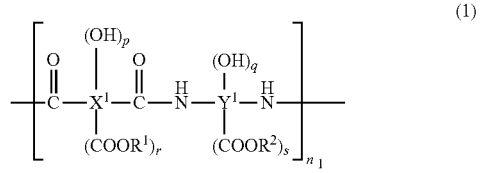

wherein in formula (1):
X$^1$ and Y$^1$ each independently represents an organic group having two to eight valences and containing two or more carbon atoms;
R$^1$ and R$^2$ each independently represents a hydrogen atom or a C$_1$-C$_{20}$ organic group;
n$_1$ is an integer number from 2 to 500;
p and q are each independently an integer number from 0 to 4; and
r and s each independently represents an integer number from 0 to 2;

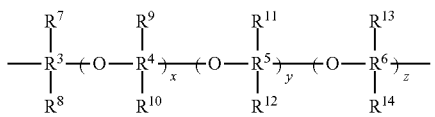

wherein in formula (2):
R$^3$ to R$^6$ each independently represents a C$_1$-C$_6$ alkylene group;
R$^7$ to R$^{14}$ each independently represents a hydrogen atom, fluorine atom, or C$_1$-C$_6$ alkyl group, provided that the structures indicated in parentheses are different from each other; and
x, y, and z each independently represents an integer number from 0 to 35, and x+y+z≥2.

2. The cured film according to claim 1, wherein the content of the polyether structural unit represented by the general formula (2) is 5 to 40% by mole of a total of diamine residues.

3. The cured film according to claim 2, wherein the molecular weight of the polyether structural unit represented by the general formula (2) is not less than 150 and not more than 2,000.

4. The cured film according to claim 2, wherein the polyether structural unit represented by the general formula (2) comprises a tetramethylene ether glycol structural unit.

5. The cured film according to claim 1, wherein the molecular weight of the polyether structural unit represented by the general formula (2) is not less than 150 and not more than 2,000.

6. The cured film according to claim 1, wherein the polyether structural unit represented by the general formula (2) comprises a tetramethylene ether glycol structural unit.

7. The cured film according to claim 1, wherein the photosensitive resin composition further comprises a compound (B) that generates an acid upon light exposure, and a heat-crosslinker (C).

8. The cured film according to claim 1, wherein the photosensitive resin composition further comprises a compound (D) selected from the group consisting of:

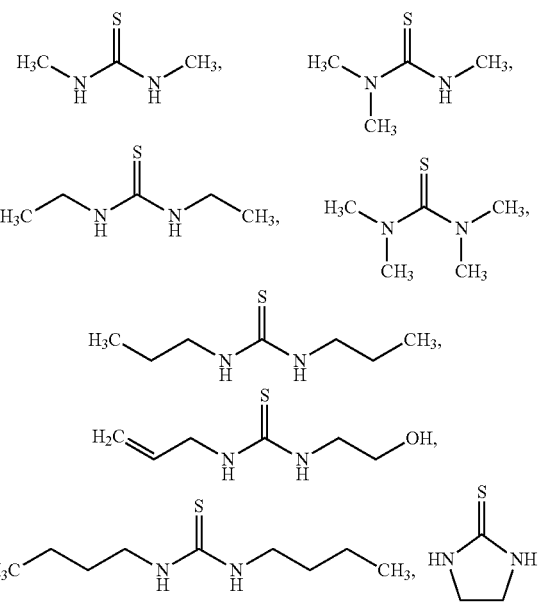

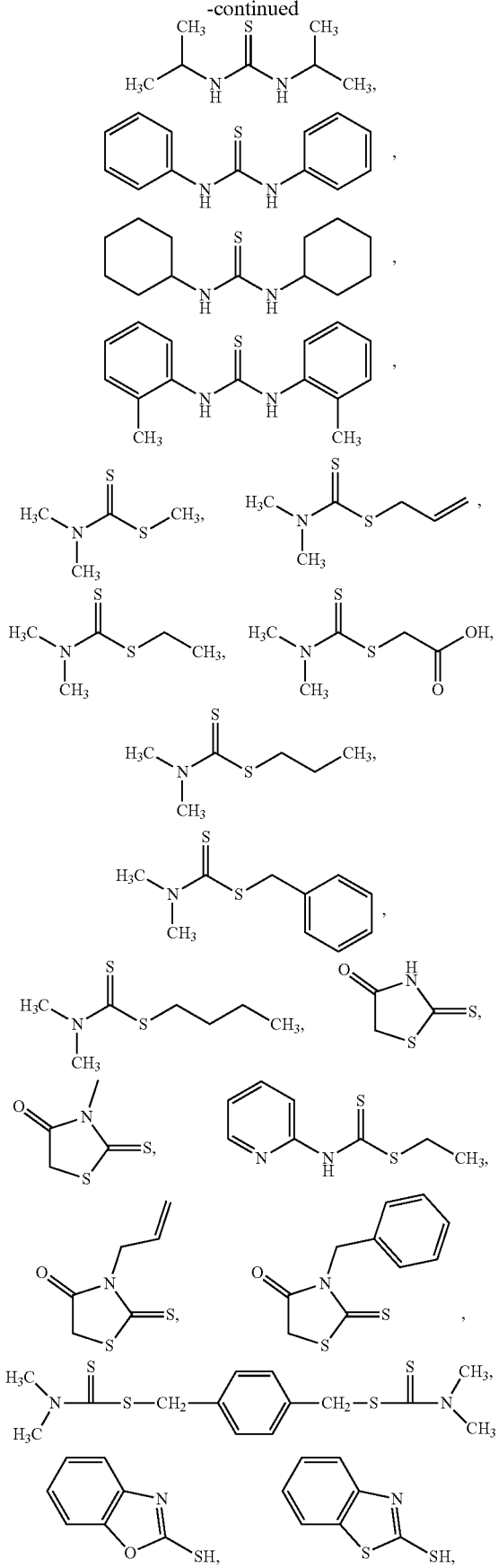
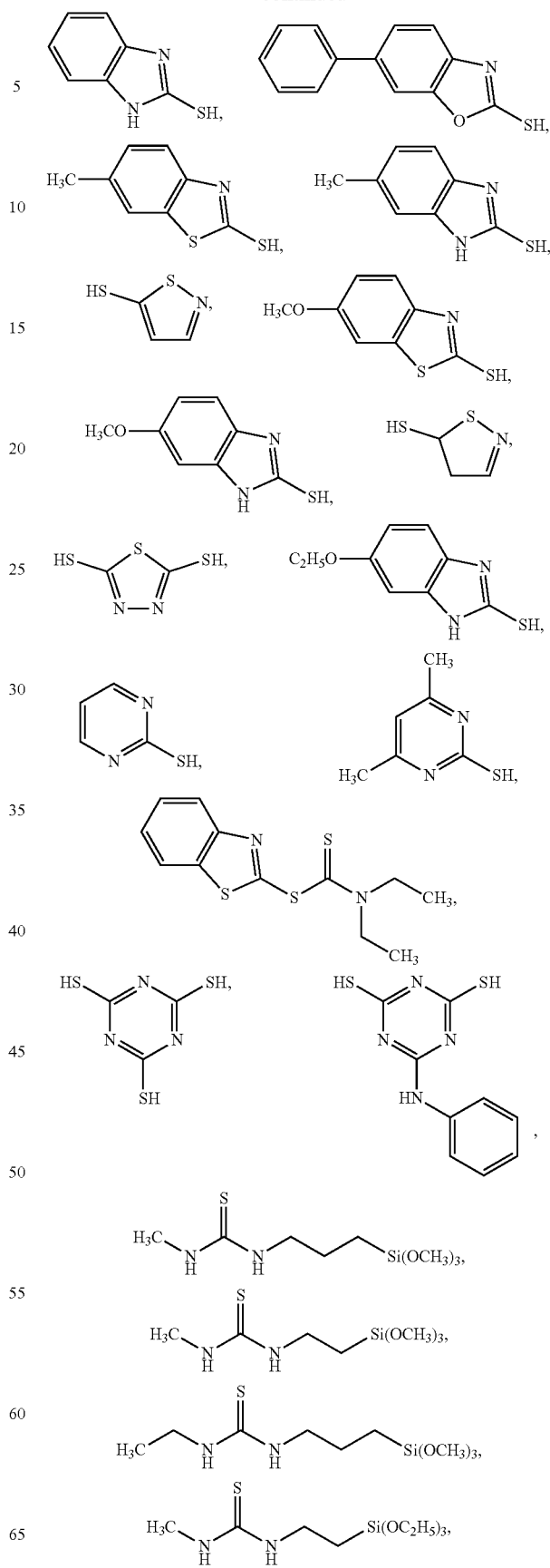

-continued

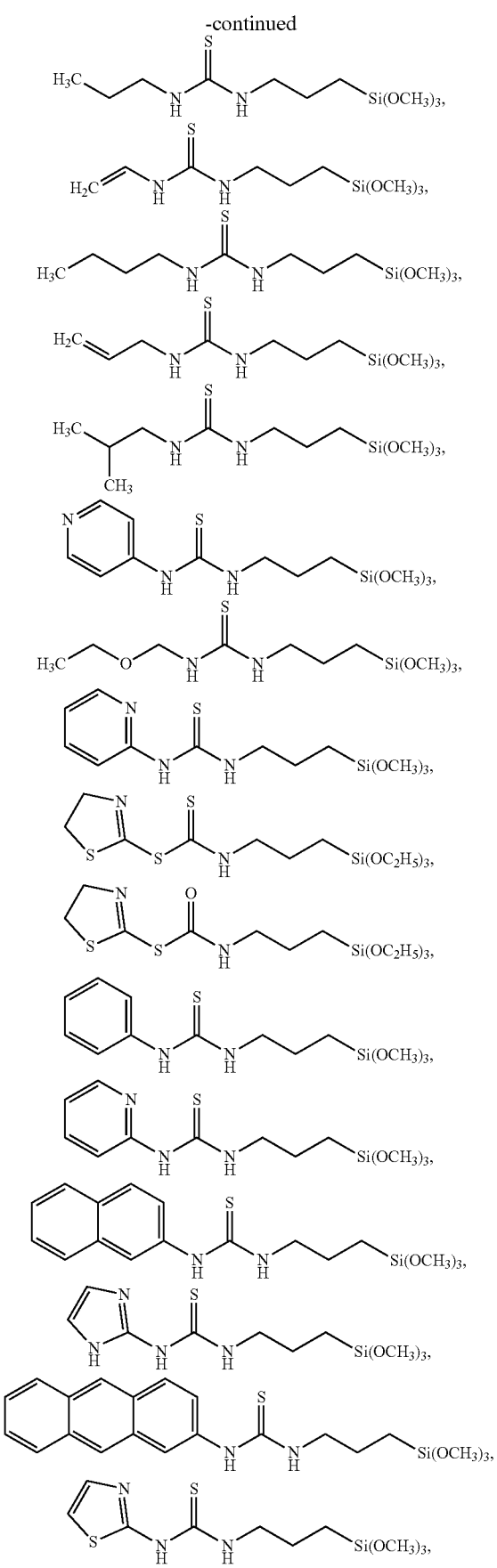

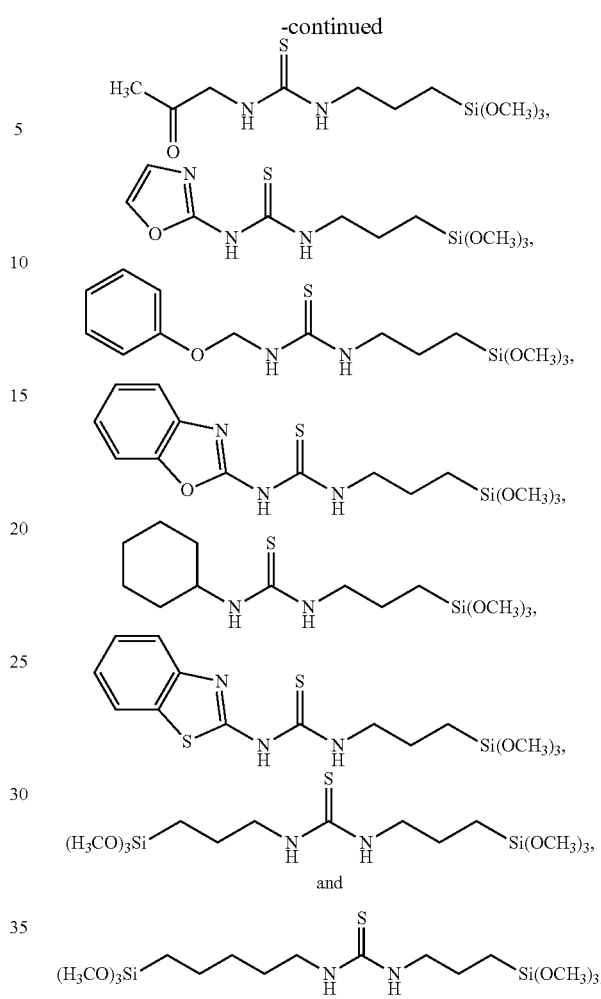

9. The cured film according to claim 1, wherein the photosensitive resin composition further comprises a compound (E) represented by the general formula (4):

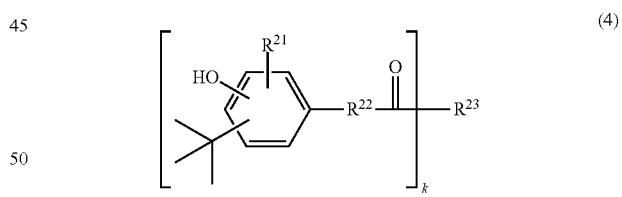

wherein, in the general formula (4), $R^{21}$ represents a hydrogen atom or an alkyl group containing two or more carbon atoms;
$R^{22}$ represents an alkylene group containing two or more carbon atoms;
$R^{23}$ represents an organic group having one to four valences and comprising at least one selected from the group of an alkylene group containing two or more carbon atoms, an O atom, and an N atom; and
k represents an integer number from 1 to 4.

10. The cured film according to claim 1, wherein the photosensitive resin composition further comprises a heat-crosslinker (F) having a structural unit represented by the general formula (5) below

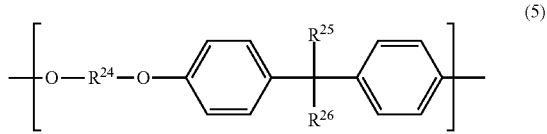
(5)

wherein, in the general formula (5), $R^{25}$ and $R^{26}$ each independently represents a hydrogen atom or a methyl group; and $R^{24}$ is a divalent organic group comprising an alkylene group containing two or more carbon atoms, which is optionally linear, branched, or cyclic.

11. A method of manufacturing the cured film according to claim 1, the method comprising the steps of:
applying the photosensitive resin composition onto a substrate and drying it to form a photosensitive resin film, or forming a photosensitive sheet from the photosensitive resin composition and laminating it onto a substrate to form a photosensitive resin film;
exposing the photosensitive resin film to light;
dissolving or removing the exposed portion with an alkaline solution; and
heat-treating the resulting film.

12. The method of manufacturing the cured film according to claim 11, wherein the step of heat-treating the photosensitive resin film comprises heat-treating at a temperature not lower than 170° C. and not higher than 250° C.

13. An interlayer insulating film or semiconductor protective film comprising the cured film according to claim 1.

14. A semiconductor electronic component or semiconductor device comprising a relief pattern layer of the cured film according to claim 1.

15. A semiconductor electronic component or semiconductor device, wherein the cured film according to claim 1 is deposited as an interlayer insulating film between re-wiring layers.

16. The semiconductor electronic component or semiconductor device according to claim 15, wherein a combination of the re-wiring layer and the interlayer insulating film is repeatedly arranged two to ten times.

17. A semiconductor electronic component or semiconductor device, wherein the cured film according to claim 1 is an interlayer insulating film and is between adjacent substrates.

* * * * *